(12) United States Patent
Chen et al.

(10) Patent No.: US 10,877,067 B2
(45) Date of Patent: Dec. 29, 2020

(54) PIN-TYPE PROBES FOR CONTACTING ELECTRONIC CIRCUITS AND METHODS FOR MAKING SUCH PROBES

(71) Applicant: Microfabrica Inc., Van Nuys, CA (US)

(72) Inventors: Richard T. Chen, San Jose, CA (US); Ezekiel J. J. Kruglick, San Diego, CA (US); Vacit Arat, Pasadena, CA (US); Daniel I. Feinberg, Sylmar, CA (US)

(73) Assignee: Microfabrica Inc., Van Nuys, CA (US)

( * ) Notice: Subject to any disclaimer, the term of this patent is extended or adjusted under 35 U.S.C. 154(b) by 102 days.

(21) Appl. No.: 16/172,354

(22) Filed: Oct. 26, 2018

(65) Prior Publication Data
US 2019/0204354 A1    Jul. 4, 2019

Related U.S. Application Data

(63) Continuation of application No. 14/927,350, filed on Oct. 29, 2015, now Pat. No. 10,416,192, which is a continuation of application No. 14/260,072, filed on Apr. 23, 2014, now abandoned, which is a continuation of application No. 13/273,873, filed on Oct. 14, 2011, now Pat. No. 8,723,543, which is a continuation of application No. 13/251,789, filed on Oct. 3, 2011, now Pat. No. 8,717,055, which is a continuation of application No. 13/025,511, filed on Feb. 11, 2011, now abandoned, which is a continuation of application No. 12/724,287, filed on Mar. 15, 2010, now abandoned, which is a continuation of application No. 11/695,597, filed on
(Continued)

(51) Int. Cl.
*G01R 1/067*    (2006.01)

(52) U.S. Cl.
CPC ...... *G01R 1/06727* (2013.01); *G01R 1/06738* (2013.01)

(58) Field of Classification Search
CPC .......................... G01R 1/067; G01R 1/06716; G01R 1/06727; G01R 1/06733; G01R 1/06738; G01R 1/06744; G01R 1/07357
See application file for complete search history.

(56) References Cited

U.S. PATENT DOCUMENTS

| | | |
|---|---|---|
| 2,306,082 A | 12/1942 | Prest |
| 3,240,685 A | 3/1966 | Maissel |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Minh N Tang
(74) *Attorney, Agent, or Firm* — Dennis R. Smalley

(57) ABSTRACT

Pin probes and pin probe arrays are provided that allow electric contact to be made with selected electronic circuit components. Some embodiments include one or more compliant pin elements located within a sheath. Some embodiments include pin probes that include locking or latching elements that may be used to fix pin portions of probes into sheaths. Some embodiments provide for fabrication of probes using multi-layer electrochemical fabrication methods.

23 Claims, 16 Drawing Sheets

Related U.S. Application Data

Apr. 2, 2007, now Pat. No. 7,679,388, which is a continuation of application No. 11/028,960, filed on Jan. 3, 2005, now Pat. No. 7,265,565, which is a continuation-in-part of application No. 10/949,738, filed on Sep. 24, 2004, now abandoned, said application No. 10/949,738 is a continuation-in-part of application No. 10/772,943, filed on Feb. 4, 2004, now abandoned.

(60) Provisional application No. 60/582,689, filed on Jun. 23, 2004, provisional application No. 60/582,690, filed on Jun. 23, 2004, provisional application No. 60/609,719, filed on Sep. 13, 2004, provisional application No. 60/611,789, filed on Sep. 20, 2004, provisional application No. 60/540,511, filed on Jan. 29, 2004, provisional application No. 60/533,933, filed on Dec. 31, 2003, provisional application No. 60/536,865, filed on Jan. 15, 2004, provisional application No. 60/533,947, filed on Dec. 31, 2003, provisional application No. 60/506,015, filed on Sep. 24, 2003, provisional application No. 60/533,933, filed on Dec. 31, 2003, provisional application No. 60/445,186, filed on Feb. 4, 2003.

(56) References Cited

U.S. PATENT DOCUMENTS

| | | |
|---|---|---|
| 3,697,401 A | 10/1972 | Lucas et al. |
| 3,723,197 A | 3/1973 | Buschow et al. |
| 3,745,105 A | 7/1973 | Kosowsky et al. |
| 3,832,632 A | 8/1974 | Ardezzone |
| 3,835,017 A | 9/1974 | Mentone et al. |
| 3,874,855 A | 4/1975 | Legrand |
| 3,926,916 A | 12/1975 | Mastrangelo |
| 4,043,891 A | 8/1977 | Alkire et al. |
| 4,080,267 A | 3/1978 | Castellani et al. |
| 4,126,533 A | 11/1978 | Lukyanchikov et al. |
| 4,155,815 A | 5/1979 | Francis et al. |
| 4,187,553 A | 2/1980 | Ahn et al. |
| 4,294,669 A | 10/1981 | Lincoln et al. |
| 4,298,436 A | 11/1981 | Thomas |
| 4,370,941 A | 2/1983 | Belton |
| 4,376,017 A | 3/1983 | Urion |
| 4,404,080 A | 9/1983 | Jahani |
| 4,452,684 A | 6/1984 | Palnik |
| 4,537,647 A | 8/1985 | Foster |
| 4,575,330 A | 3/1986 | Hull |
| 4,600,555 A | 7/1986 | Shimizu |
| 4,752,352 A | 6/1988 | Feygin |
| 4,764,449 A | 8/1988 | Vanlseghem |
| 4,770,754 A | 9/1988 | Meuldijk et al. |
| 4,920,639 A | 5/1990 | Yee |
| 4,921,583 A | 5/1990 | Sewell et al. |
| 4,954,192 A | 9/1990 | Dziekan |
| 4,955,523 A | 9/1990 | Carlommagno et al. |
| 4,961,052 A | 10/1990 | Tada et al. |
| 4,961,154 A | 10/1990 | Pomerantz et al. |
| 4,985,116 A | 1/1991 | Mettler et al. |
| 5,011,580 A | 4/1991 | Pan et al. |
| 5,020,219 A | 6/1991 | Leedy |
| 5,059,359 A | 10/1991 | Hull et al. |
| 5,070,297 A | 12/1991 | Kwon et al. |
| 5,177,438 A | 1/1993 | Littlebury et al. |
| 5,189,507 A | 2/1993 | Carlomagno et al. |
| 5,190,637 A | 3/1993 | Guckel |
| 5,209,817 A | 5/1993 | Ahmad et al. |
| 5,209,878 A | 5/1993 | Smalley et al. |
| 5,271,822 A | 12/1993 | Nolan et al. |
| 5,273,691 A | 12/1993 | Hull et al. |
| 5,301,415 A | 4/1994 | Prinz et al. |
| 5,354,712 A | 10/1994 | Ho et al. |
| 5,369,881 A | 12/1994 | Inaba et al. |
| 5,378,583 A | 1/1995 | Guckel et al. |
| 5,395,508 A | 3/1995 | Jolly et al. |
| 5,413,668 A | 5/1995 | Aslam et al. |
| 5,435,902 A | 7/1995 | Andre |
| 5,436,412 A | 7/1995 | Ahmad et al. |
| 5,472,539 A | 12/1995 | Saia et al. |
| 5,476,211 A | 12/1995 | Khandros |
| 5,476,818 A | 12/1995 | Yanof et al. |
| 5,478,699 A | 12/1995 | Blessington et al. |
| 5,501,784 A | 3/1996 | Lessmo/Ilmann et al. |
| 5,512,162 A | 4/1996 | Sachs et al. |
| 5,512,163 A | 4/1996 | Warfield |
| 5,513,430 A | 5/1996 | Yanof et al. |
| 5,545,045 A | 8/1996 | Wakamatsu |
| 5,560,837 A | 10/1996 | Trueba |
| 5,578,185 A | 11/1996 | Bergeron et al. |
| 5,596,504 A | 1/1997 | Tata et al. |
| 5,605,614 A | 2/1997 | Bornand |
| 5,614,075 A | 3/1997 | Andre |
| 5,641,391 A | 6/1997 | Hunter et al. |
| 5,686,689 A | 11/1997 | Snedeker et al. |
| 5,700,607 A | 12/1997 | Rath et al. |
| 5,766,441 A | 6/1998 | Arndt et al. |
| 5,772,451 A | 6/1998 | Dozier et al. |
| 5,805,971 A | 9/1998 | Akedo |
| 5,806,181 A | 9/1998 | Khandros et al. |
| 5,820,014 A | 10/1998 | Dozier et al. |
| 5,829,128 A | 11/1998 | Eldridge et al. |
| 5,832,834 A | 11/1998 | Nishino et al. |
| 5,864,946 A | 2/1999 | Eldridge et al. |
| 5,874,011 A | 2/1999 | Ehrlich |
| 5,876,424 A | 3/1999 | O'Phelan et al. |
| 5,917,707 A | 6/1999 | Khandros et al. |
| 5,923,637 A | 7/1999 | Shimada et al. |
| 5,945,058 A | 8/1999 | Manners et al. |
| 5,974,662 A | 11/1999 | Eldridge et al. |
| 5,989,994 A | 11/1999 | Khoury et al. |
| 5,994,152 A | 11/1999 | Khandros et al. |
| 5,999,184 A | 12/1999 | Smalley et al. |
| 6,016,000 A | 1/2000 | Moslehi |
| 6,019,784 A | 2/2000 | Hines |
| 6,023,103 A | 2/2000 | Chang et al. |
| 6,027,630 A | 2/2000 | Cohen |
| 6,029,096 A | 2/2000 | Manners et al. |
| 6,043,563 A | 3/2000 | Eldridge et al. |
| 6,044,548 A | 4/2000 | Distefano et al. |
| 6,064,213 A | 5/2000 | Khandros et al. |
| 6,184,053 B1 | 2/2001 | Eldridge et al. |
| 6,197,180 B1 | 3/2001 | Kelly |
| 6,208,225 B1 | 3/2001 | Miller |
| 6,218,910 B1 | 4/2001 | Miller |
| 6,239,385 B1 | 5/2001 | Schwiebert et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,268,261 B1 | 7/2001 | Petrarca et al. |
| 6,289,781 B1 | 9/2001 | Cohen |
| 6,333,741 B1 | 12/2001 | Snead et al. |
| 6,336,269 B1 | 1/2002 | Eldridge et al. |
| 6,413,852 B1 | 7/2002 | Grill et al. |
| 6,441,315 B1 | 8/2002 | Eldridge et al. |
| 6,456,099 B1 | 9/2002 | Eldridge et al. |
| 6,475,369 B1 | 11/2002 | Cohen |
| 6,482,013 B2 | 11/2002 | Eldridge et al. |
| 6,483,328 B1 | 11/2002 | Eldridge et al. |
| 6,491,968 B1 | 12/2002 | Mathieu et al. |
| 6,499,216 B1 | 12/2002 | Fjelstad |
| 6,509,751 B1 | 1/2003 | Mathieu et al. |
| 6,520,778 B1 | 2/2003 | Eldridge et al. |
| 6,539,531 B2 | 3/2003 | Miller et al. |
| 6,596,624 B1 | 7/2003 | Romankiw |
| 6,624,648 B2 | 9/2003 | Eldridge et al. |
| 6,627,483 B2 | 9/2003 | Ondricek et al. |
| 6,640,415 B2 | 11/2003 | Eslamy et al. |
| 6,651,325 B2 | 11/2003 | Lee et al. |
| 6,672,875 B1 | 1/2004 | Mathieu et al. |
| 6,690,185 B1 | 2/2004 | Khandros et al. |
| 6,690,186 B2 | 2/2004 | Fjelstad |
| 6,692,145 B2 | 2/2004 | Gianchandani et al. |

(56) References Cited

U.S. PATENT DOCUMENTS

| | | |
|---|---|---|
| 6,705,876 B2 | 3/2004 | Eldridge |
| 6,713,374 B2 | 3/2004 | Eldridge et al. |
| 6,729,019 B2 | 5/2004 | Grube et al. |
| 6,790,377 B1 | 9/2004 | Cohen |
| 6,817,052 B2 | 11/2004 | Grube |
| 6,838,893 B2 | 1/2005 | Khandros, Jr. et al. |
| 6,838,894 B2 | 1/2005 | MacIntyre |
| 6,913,468 B2 | 7/2005 | Dozier, II et al. |
| 6,948,940 B2 | 9/2005 | Lindsey et al. |
| 6,967,492 B2 * | 11/2005 | Tsui .................. G01R 1/06733 324/755.05 |
| 7,086,149 B2 | 8/2006 | Eldridge et al. |
| 7,142,000 B2 | 11/2006 | Eldridge et al. |
| 7,195,989 B2 | 3/2007 | Lockard et al. |
| 7,239,219 B2 | 7/2007 | Brown et al. |
| 7,252,861 B2 | 8/2007 | Smalley |
| 7,265,565 B2 | 9/2007 | Chen et al. |
| 7,271,888 B2 | 9/2007 | Frodis et al. |
| 7,287,322 B2 | 10/2007 | Mathieu et al. |
| 7,412,767 B2 | 8/2008 | Kim et al. |
| 7,498,714 B2 | 3/2009 | Lockard et al. |
| 7,527,721 B2 | 5/2009 | Lembrikov et al. |
| 7,531,077 B2 | 5/2009 | Cohen et al. |
| 7,640,651 B2 | 1/2010 | Cohen et al. |
| 2002/0053734 A1 | 5/2002 | Eldridge et al. |
| 2002/0067181 A1 | 6/2002 | Eldridge et al. |
| 2003/0143492 A1 | 7/2003 | Sexton |
| 2003/0161750 A1 | 8/2003 | Moxson et al. |
| 2003/0186405 A1 | 10/2003 | Lee et al. |
| 2004/0004001 A1 | 1/2004 | Cohen et al. |
| 2004/0007470 A1 | 1/2004 | Smalley |
| 2004/0072452 A1 | 4/2004 | Eldridge et al. |
| 2004/0112637 A1 | 6/2004 | Kim et al. |
| 2005/0029109 A1 | 2/2005 | Zhang et al. |
| 2005/0029225 A1 | 2/2005 | Zhang |
| 2005/0032375 A1 | 2/2005 | Lockard et al. |
| 2005/0045585 A1 | 3/2005 | Zhang et al. |
| 2005/0067292 A1 | 3/2005 | Thompson et al. |
| 2005/0072681 A1 | 4/2005 | Cohen et al. |
| 2005/0142846 A1 | 6/2005 | Frodis et al. |
| 2005/0148214 A1 | 7/2005 | Mathieu et al. |
| 2005/0179458 A1 | 8/2005 | Chen et al. |
| 2005/0184748 A1 | 8/2005 | Chen et al. |
| 2005/0202667 A1 | 9/2005 | Cohen et al. |
| 2005/0215023 A1 | 9/2005 | Cohen et al. |
| 2005/0230261 A1 | 10/2005 | Cohen et al. |
| 2006/0006888 A1 | 1/2006 | Kruglick et al. |
| 2006/0108678 A1 | 5/2006 | Kumar et al. |
| 2006/0216920 A1 | 9/2006 | Kojima |
| 2006/0226015 A1 | 10/2006 | Smalley et al. |
| 2006/0238209 A1 | 10/2006 | Chen et al. |
| 2008/0050524 A1 | 2/2008 | Kumar et al. |
| 2008/0121343 A1 | 5/2008 | Cohen et al. |
| 2010/0051466 A1 | 3/2010 | Smalley et al. |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Kumar, et al., "Features of gold having micrometer to centimeter dimensions can be formed through a combination of stamping with an elastomeric stamp . . . " Appln. Phys. Lett., Jul. 1993, 63(14):2002-2004.

Madden, John D. et al., "Three-Dimensional Microfabrication by Localized, Electrochemical Deposition", J. of Micro. Sys., Mar. 1996, 5(1):24-32.

Marques, et al., "Fabrication of High-Aspect-Ratio Microstructures on Planar and Nonplanar Surfaces Using a Modified LIGA Process", Dec. 1997, 6(4):329-336.

Nikolay V. Vasilyev, et al., "Beating-Heart Pach Closure of Muscular Ventricular Septal Defects Under Real-Time Three Dimensional Echocardiographic Guidance: A Preclinical Study", J. Thorac, Cardiovas. Surg., 2008, pp. 603-609, vol. 153, No. 3, The American Association of Thoracic Surgery.

Nikolay V. Vasilyev, et al., "Three Dimensional Echo and Videocardioscopy-Guided Atrial Septal Defect Closure", Ann. Thorac. Surg., 2006, pp. 1322-1326, vol. 82, The Society of Thoracic Surgeons.

Osterberg, Peter M., et al., "MEMBUILDER: An Automated 3D Solid Model Construction Program for Microelectromechanical Structures", The 8th Int'l Conference on Solid-State Sensors and Actuators, and Eurosensors IX; Jun. 25-29, 1995; pp. 21-24; Stockholm, Sweden.

Taylor, et al., "'Spatial Forming' A Three Dimensional Printing Process", IEEE, 1995, pp. 203-208.

* cited by examiner

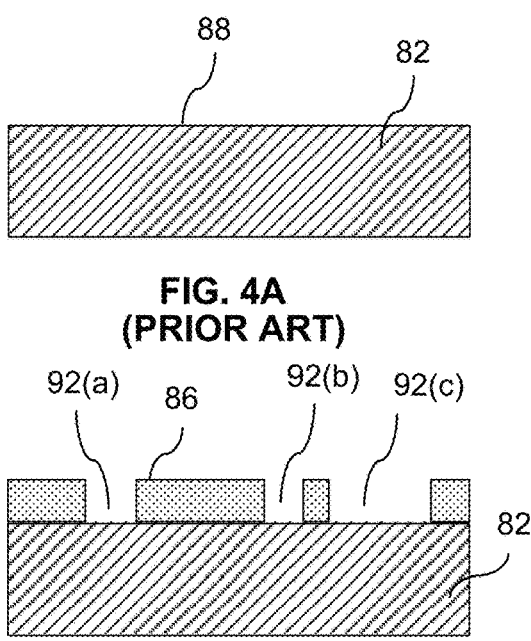
FIG. 4A
(PRIOR ART)
FIG. 4C
(PRIOR ART)
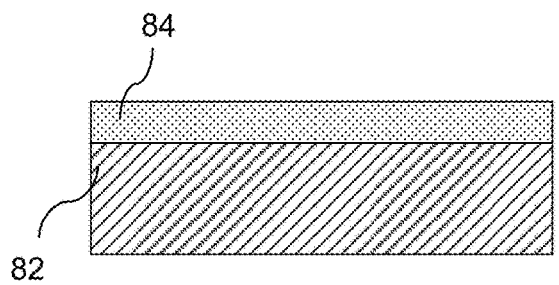
FIG. 4B
(PRIOR ART)
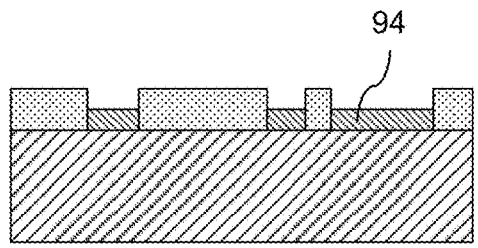
FIG. 4D
(PRIOR ART)
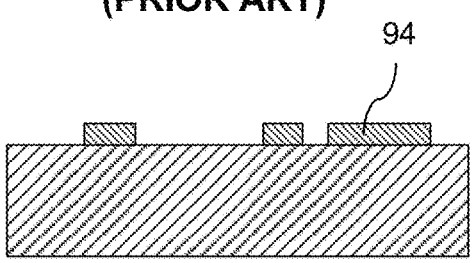
FIG. 4E
(PRIOR ART)
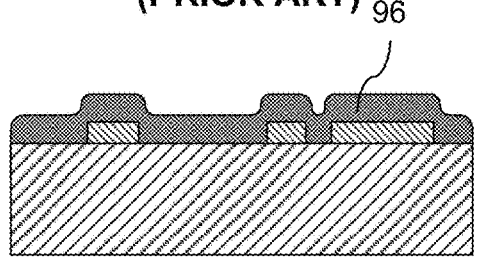
FIG. 4F
(PRIOR ART)
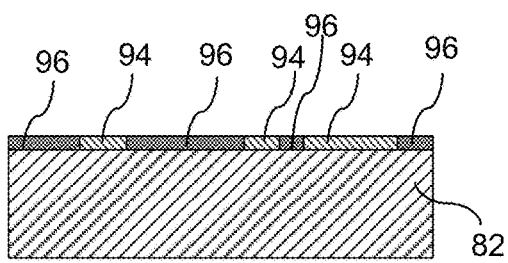
FIG. 4G
(PRIOR ART)
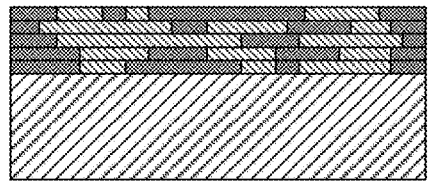
FIG. 4H
(PRIOR ART)
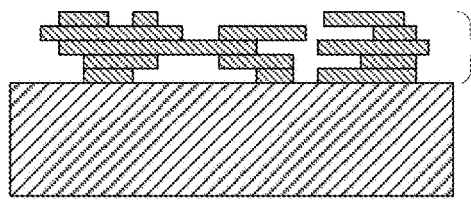
FIG. 4I
(PRIOR ART)

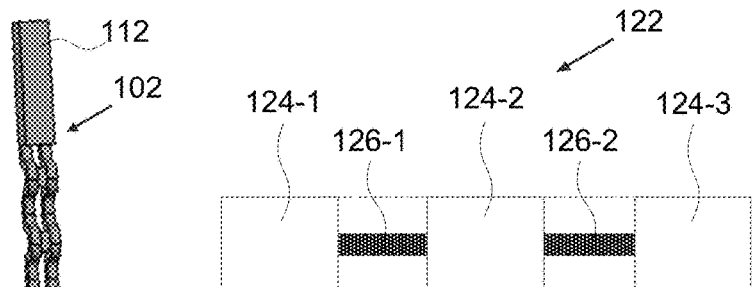
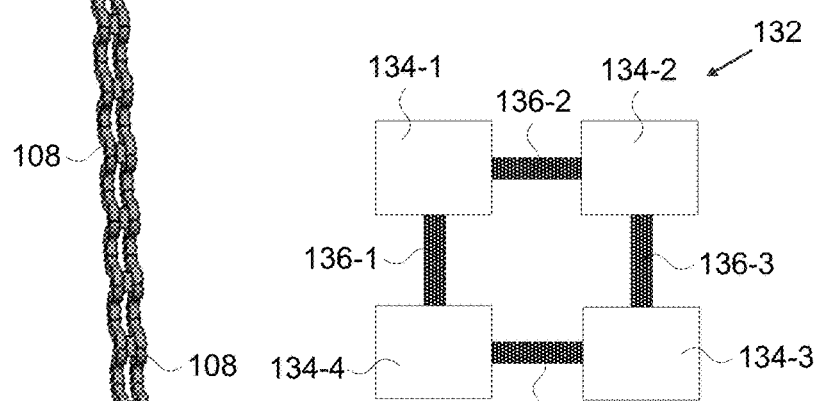
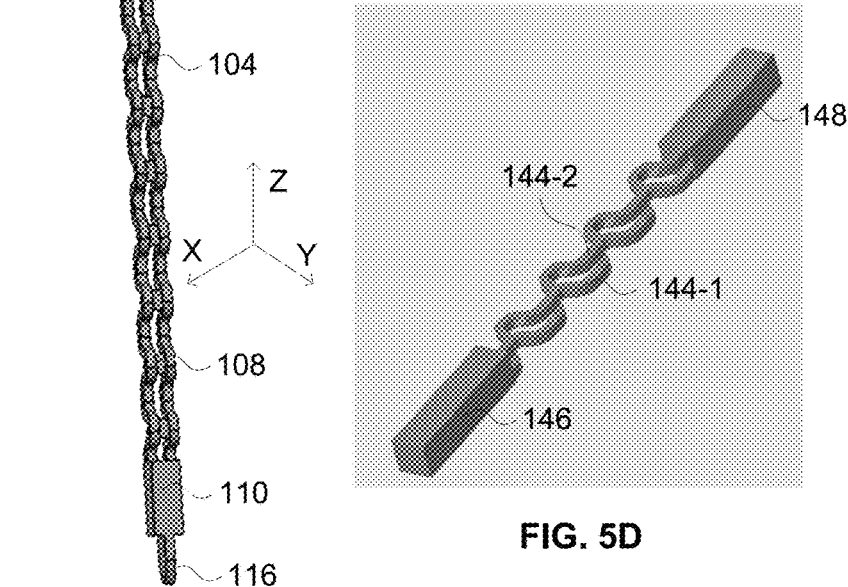
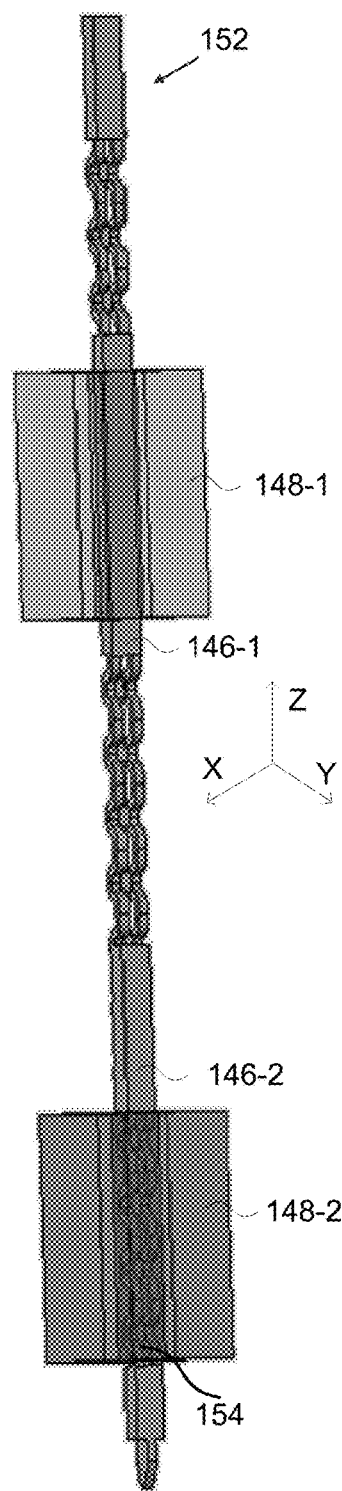
FIG. 5A  FIG. 5B  FIG. 5C  FIG. 5D  FIG. 5E

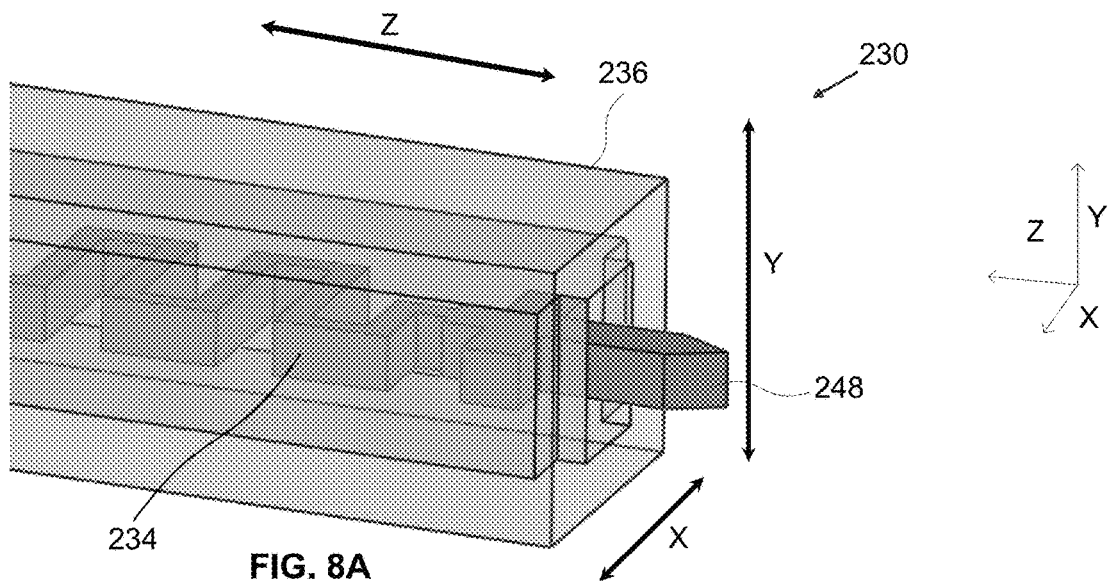
FIG. 8A
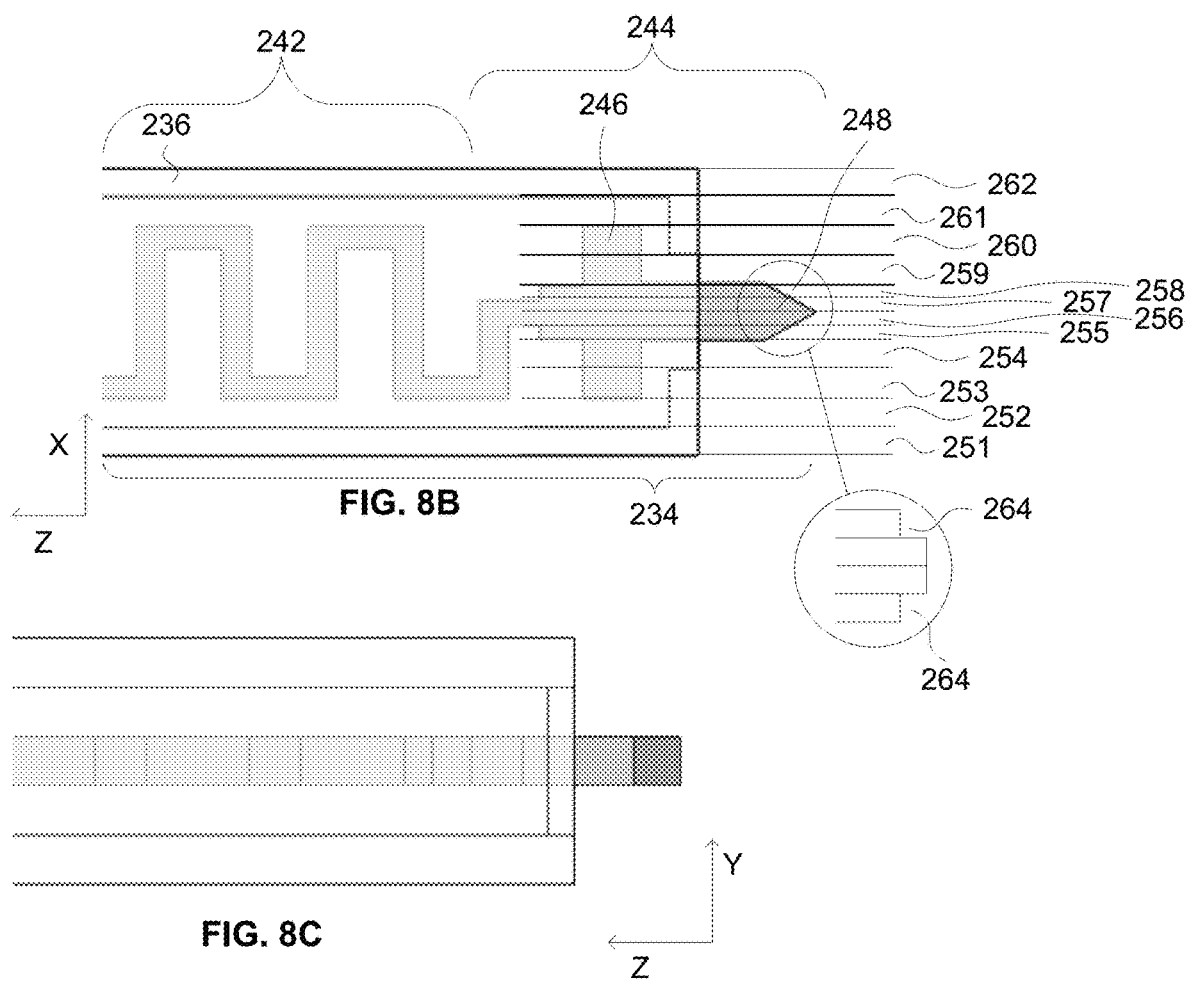
FIG. 8B
FIG. 8C

PIN-TYPE PROBES FOR CONTACTING ELECTRONIC CIRCUITS AND METHODS FOR MAKING SUCH PROBES

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| application Ser.. No. | Continuity Type | application Ser. No. | Which was Filed | Which is now | Which issued on |
|---|---|---|---|---|---|
| This application | is a CNT of | 14/927,350 | 2015 Oct. 29 | pending | — |
| 14/927,350 | is a CNT of | 14/260,072 | 2014 Apr. 23 | abandoned | — |
| 14/260,072 | is a CNT of | 13/273,873 | 2011 Oct. 14 | U.S. Pat. No. 8,723,543 | 2014 May 13 |
| 13/273,873 | is a CNT of | 13/251,789 | 2011 Oct. 3 | U.S. Pat. No. 8,717,055 | 2014 May 6 |
| 13/251,789 | is a CNT of | 13/025,511 | 2011 Feb. 11 | abandoned | — |
| 13/025,511 | is a CNT of | 12/724,287 | 2010 Mar. 15 | abandoned | — |
| 12/724,287 | is a CNT of | 11/695,597 | 2007 Apr. 2 | U.S. Pat. No. 7,679,388 | 2010 Mar. 16 |
| 11/695,597 | is a CNT of | 11/028,960 | 2005 Jan. 3 | U.S. Pat. No. 7,265,565 | 2007 Sep. 4 |
| 11/028,960 | is a CIP of | 10/949,738 | 2004 Sep. 24 | abandoned | — |
| 11/028,960 | claims benefit of | 60/582,689 | 2004 Jun. 23 | expired | — |
| 11/028,960 | claims benefit of | 60/582,690 | 2004 Jun. 23 | expired | — |
| 11/028,960 | claims benefit of | 60/609,719 | 2004 Sep. 13 | expired | — |
| 11/028,960 | claims benefit of | 60/611,789 | 2004 Sep. 20 | expired | — |
| 11/028,960 | claims benefit of | 60/540,511 | 2004 Jan. 29 | expired | — |
| 11/028,960 | claims benefit of | 60/533,933 | 2003 Dec. 31 | expired | — |
| 11/028,960 | claims benefit of | 60/536,865 | 2004 Jan. 15 | expired | — |
| 11/028,960 | claims benefit of | 60/533,947 | 2003 Dec. 31 | expired | — |
| 10/949,738 | is a CIP of | 10/772,943 | 2004 Feb. 4 | abandoned | — |
| 10/949,738 | claims benefit of | 60/506,015 | 2003 Sep. 24 | expired | — |
| 10/949,738 | claims benefit of | 60/533,933 | 2003 Dec. 31 | expired | — |
| 10/949,738 | claims benefit of | 60/536,865 | 2004 Jan. 15 | expired | — |
| 10/772,943 | claims benefit of | 60/445,186 | 2003 Feb. 4 | expired | — |
| 10/772,943 | claims benefit of | 60/506,015 | 2003 Sep. 24 | expired | — |
| 10/772,943 | claims benefit of | 60/533,933 | 2003 Dec. 31 | expired | — |
| 10/772,943 | claims benefit of | 60/536,865 | 2004 Jan. 15 | expired | — |

This application also incorporates by reference the teachings of U.S. patent application Ser. No. 11/029,180, filed Jan. 3, 2005, by Chen et al., now abandoned, and entitled "Pin-Type Probes for Contacting Electronic Circuits and Methods for Making Such Probes". This application was incorporated by reference on Jan. 3, 2005 into U.S. patent application Ser. No. 11/028,960 as listed above.

FIELD OF THE INVENTION

Embodiments of the present invention relate to microprobes (e.g. for use in the wafer level testing of integrated circuits), and more particularly to pin-like microprobes (i.e. microprobes that have vertical heights that are much greater than their widths). In some embodiments, the microprobes are produced by an electrochemical fabrication.

BACKGROUND OF THE INVENTION

Electrochemical Fabrication:

An electrochemical fabrication technique for forming three-dimensional structures (e.g. parts, components, devices, and the like) from a plurality of adhered layers has been or is being commercially pursued by Microfabrica® Inc. (formerly MEMGen Corporation) of Van Nuys, Calif. under the process names EFAB™ and MICA Freeform®.

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING™) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition process for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically, this material is either a structural material or a sacrificial material.
2. Then, blanket depositing at least one additional material by electrodeposition so that the additional deposit covers both the regions that were previously selectively deposited onto, and the regions of the substrate that did not receive any previously applied selective depositions. Typically, this material is the other of a structural material or a sacrificial material.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

One method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). In such a process, at least one CC mask is used for each unique cross-sectional pattern that is to be plated.

The support for a CC mask may be a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In some implementations, a single structure, part or device may be formed during execution of the above noted steps or in other implementations (i.e. batch processes) multiple identical or different structures, parts, or devices, may be built up simultaneously.

In preparation for performing the selective deposition of the first operation, the conformable portion of the CC mask is placed in registration with and pressed against a selected portion of (1) the substrate, (2) a previously formed layer or (3) a previously deposited material forming a portion of a layer that is being formed. The pressing together of the CC mask and relevant substrate, layer, or material occurs in such a way that all openings, in the conformable portions of the CC mask contain plating solution. The conformable material of the CC mask that contacts the substrate, layer, or material acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C.

The CC mask plating process is distinct from a "through-mask" plating process in that in a through-mask plating process the separation of the masking material from the substrate would occur destructively. Furthermore, in a through mask plating process, openings in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned state. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting and patterning of the photoresist (i.e. voids formed in the photoresist) is formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along with the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example, it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide pin probes (e.g. pogo pin probes) with improved characteristics.

It is an object of some embodiments of the invention to provide pin probes that are more reliable.

It is an object some embodiments of the invention to provide improved methods for fabricating pin probes.

Other objects and advantages of various aspects of the invention will be apparent to those of skill in the art upon review of the teachings herein. The various aspects of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single aspect of the invention even though that may be the case with regard to some aspects.

A first aspect of the invention provides a pin probe for making electrical contact to an electronic circuit element, including: (A) a pin element, including: (1) a first contact tip portion; (2) a second contact tip portion; and (3) a compliant portion having a first end and a second end, wherein the first end is functionally connected to the first tip portion and the second end is functionally connected to the second tip portion, and wherein the compliant portion includes at least one element that comprises a plurality of turns.

A second aspect of the invention provides a method for fabricating a pin probe, including: (A) providing a substrate; (B) forming a plurality of deposited layers of material on the substrate according to a design of the pin; and (C) releasing the pin probe from any sacrificial material used in forming the plurality of layers and from the substrate.

A third aspect of the invention provides a pin probe for making electrical contact to an electronic circuit element, including: (A) a pin element, including: (1) a first contact tip portion; and (2) a compliant portion having a first end and a second end, wherein the first end is functionally connected to the first tip portion and wherein the compliant portion includes at least one element that comprises a plurality of turns.

Further aspects of the invention will be understood by those of skill in the art upon reviewing the teachings herein. These further aspects of the invention may involve apparatus that can be used in implementing one or more of the above method aspects of the invention or involve methods for fabricating structures according to various apparatus aspects set forth above. These other aspects of the invention may provide various combinations of the aspects presented above, various combinations of embodiments disclosed herein as well as provide other configurations, structures, functional relationships, and processes that have not been specifically set forth above.

BRIEF DESCRIPTION OF THE DRAWINGS

FIGS. 4A-4I schematically depict the formation of a first layer of a structure using adhered mask plating where the blanket deposition of a second material overlays both the openings between deposition locations of a first material and the first material itself.

FIG. 5A provides a probe configuration of a first embodiment of the invention.

FIGS. 5B and 5C depict top views of examples of probes formed from one-dimensional (FIG. 5B) and two-dimensional (FIG. 5C) arrays of compliant elements.

FIG. 5D provides an example of an alternative structural design for the compliant regions of the pin probe of FIG. 5A.

FIG. 5E provides an alternative design for the pin probe of FIG. 5A where the pin probe includes non-compliant regions as well as compliant regions.

FIG. 8A depicts a partially transparent, perspective view of an end portion of a rectangular serpentine pin probe located within a sheath.

FIG. 8B depicts a partially transparent side view of the probe of FIG. 8A where the probe is to be built from a plurality of layers and where the compliant serpentine structure of the probe occurs in a direction perpendicular to the planes of layers from which the probe is formed.

FIG. 8C depicts a partially transparent side view of the probe of FIG. 8A where the probe is to be built from a plurality of layers and where the compliant serpentine structure lies in the planes of layers from which the probe is formed.

FIG. 12A depicts a partially transparent, perspective view of an end of a pin probe in a sheath where the pin probe has a compliant structure composed of a spiral spring while

FIGS. 13A and 13B depict examples of flattened pogo pins (i.e. the sheath does not have equal width along two perpendicular directions that are also perpendicular to the axis of the probe) while

DETAILED DESCRIPTION OF PREFERRED EMBODIMENTS OF THE INVENTION

Figure 1A:
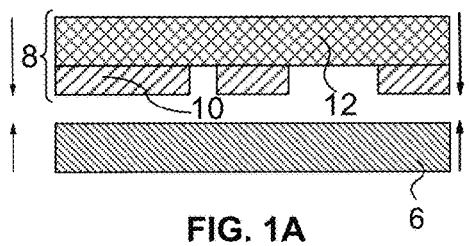
FIGS. 1A-1C schematically depict side views of various stages of a CC mask plating process, while FIGS. 1D-1G schematically depict a side views of various stages of a CC mask plating process using a different type of CC mask.
Figure 1B:
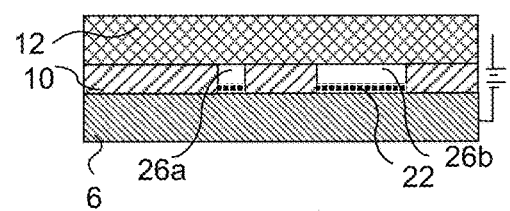
Figure 1C:
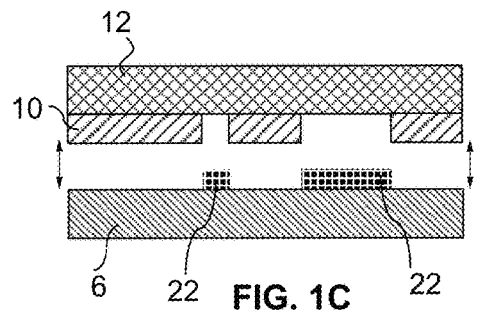
Figure 1D:
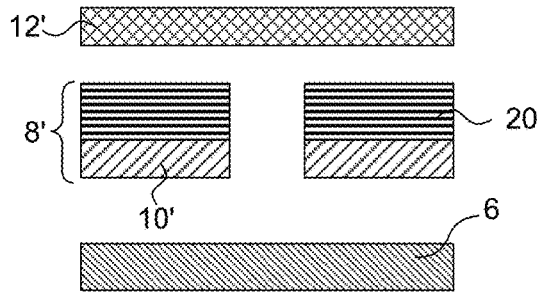
Figure 1E:
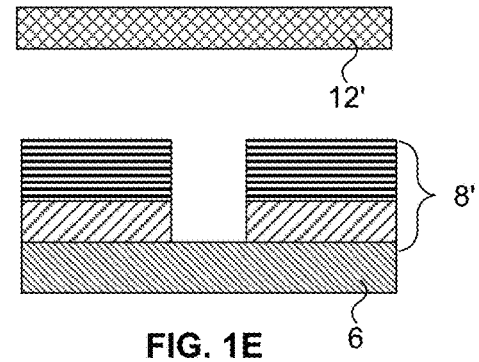
Figure 1F:
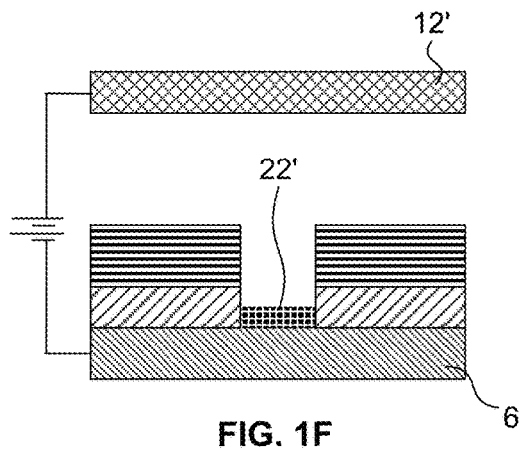
Figure 1G:
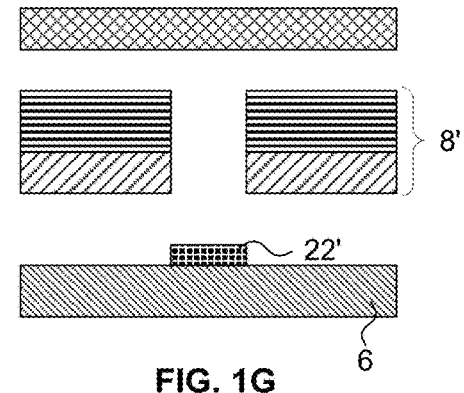
Figure 2A:
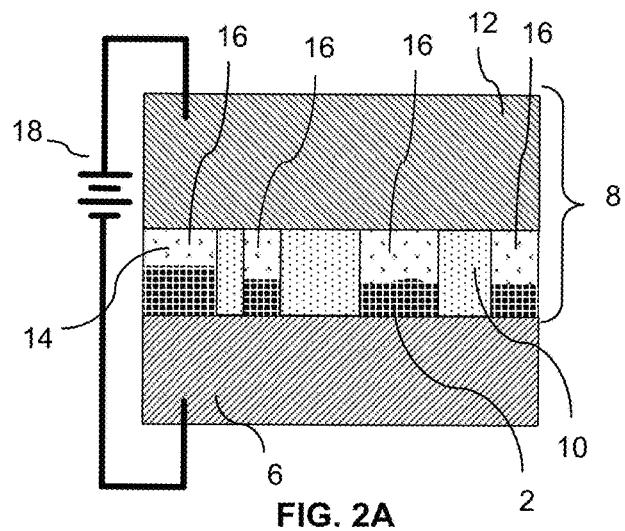
FIGS. 2A-2F schematically depict side views of various stages of an electrochemical fabrication process as applied to the formation of a particular structure where a sacrificial material is selectively deposited while a structural material is blanket deposited.
Figure 2B:
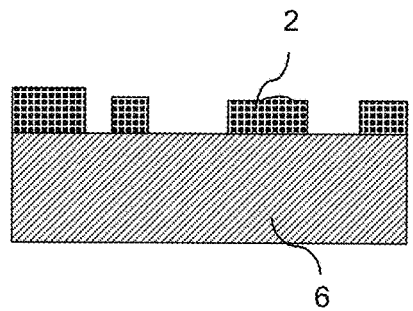
Figure 2C:
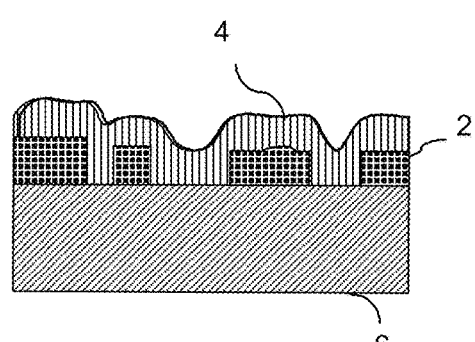
Figure 2D:
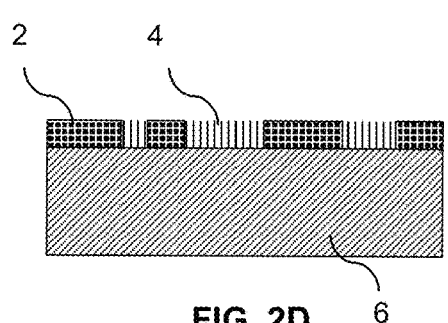
Figure 2E:
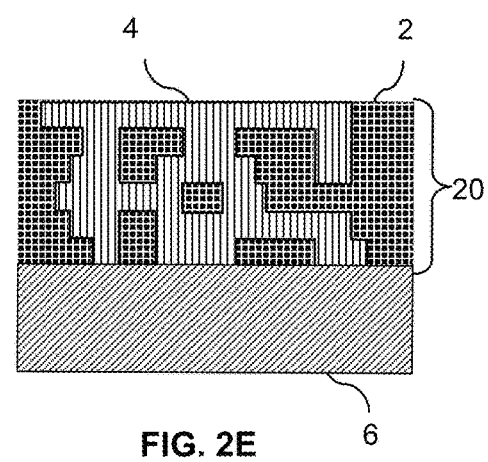
Figure 2F:
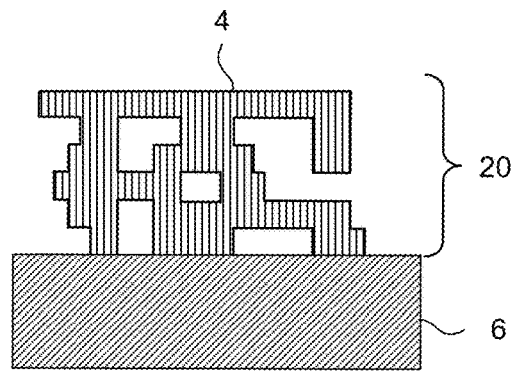
Figure 3A:
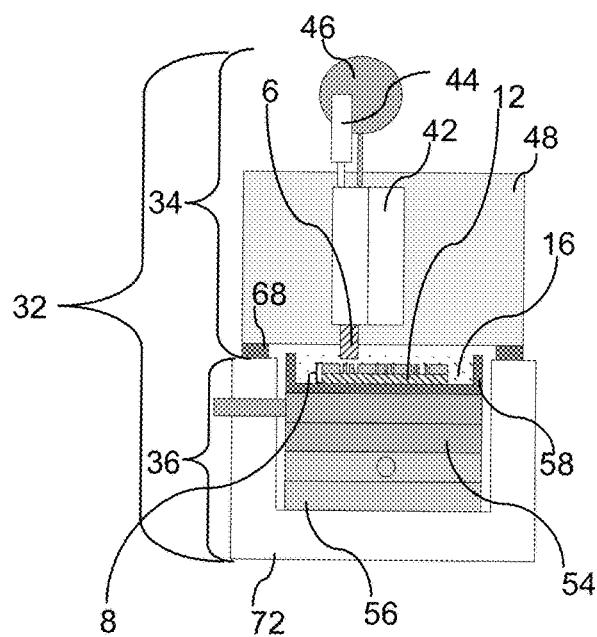
FIGS. 3A-3C schematically depict side views of various example subassemblies that may be used in manually implementing the electrochemical fabrication method depicted in FIGS. 2A-2F.
Figure 3B:
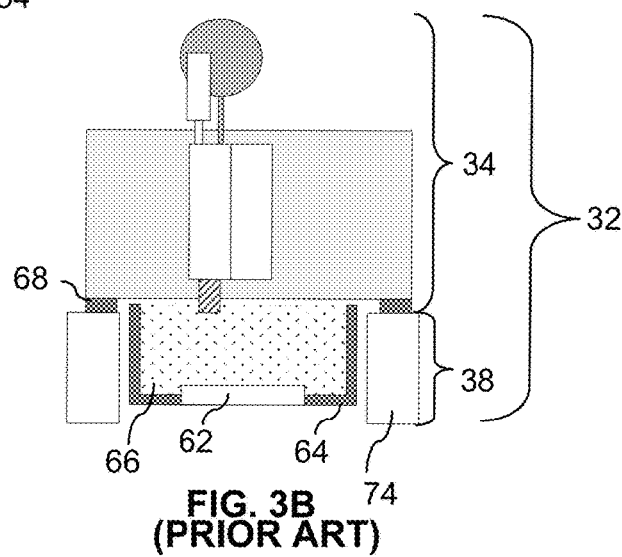
Figure 3C:
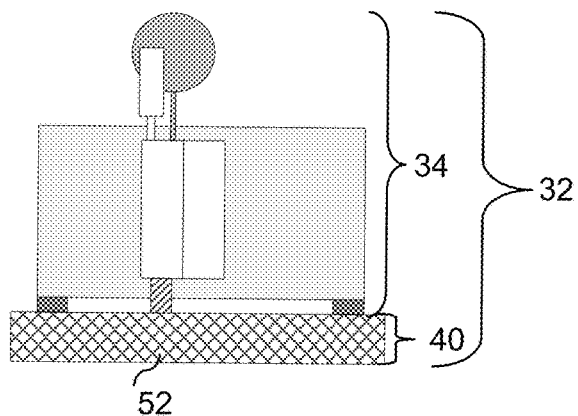

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may be combined with or be implemented via electrochemical fabrication techniques. Such combinations or implementations may be used to form multi-layer structures using a single patterning technique on all layers or using different patterning techniques on different layers. For example, different types of patterning masks and masking techniques may be used or even techniques that perform direct selective depositions without the need for masking. For example, conformable contact masks may be used during the formation of some layers while non-conformable contact masks may be used in association with the formation of other layers. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

According to some embodiments of the invention, the above noted methods are used to fabricate pin probes of various design configurations either individually or in arrays. In other embodiments, pin probe devices of various designs may be fabricated individually or as arrays using other techniques and then assembled, as appropriate, into final arrays or on final substrates.

FIG. 5A provides a probe configuration of an embodiment of the invention where the probe 102 may be termed a "pin", "pogo", or "pogo pin" due to it small cross-sectional area and extended length. As indicated in FIG. 5A, the probe 102 may include a first compliant element 104, a second compliant element 114, bridging elements 108, end pieces 110 and 112, and tip 116. The first and second compliant elements are designed to be compressible along the Z-axis. Probes like those exemplified in FIG. 5A may be configured to fit into dual-plate probe package formats (presently used with bent wire, linear beam, or buckled beam probe elements. Such pin probes may be used as replacements for cobra pins. These probes may provide direct linear compression which eliminates primary packing restrictions associated with existing linear beam probes.

Such probes may be used to form temporary electrical contact between an electronic component like a space transformer and pads of a semiconductor die or device to be tested. Such probes may be used to make permanent or semi-permanent contact between a first electronic component (e.g. a printed circuit board, PCB, or the like) and a second electronic component (e.g. a space transformer or the like). In some embodiments, such probes may form part of an interposer or other electronic component. In some embodiments, contact tips may be located on both ends of the probes while in other embodiments, no special tip configurations or materials may be used.

The spring constant and over travel capability (i.e. the distance the spring is capable of compressing along the Z-axis and returning to its original uncompressed position) may be designed to customer specifications. In some embodiments, such design variations may include changes in the height or length of the compressible portion of the probe. In some embodiments, such design variations may involve changes to the width or thickness of the elongated elements as a whole or of a selected portion of an element. In some embodiments, such design variations may involve changing the number of oscillations or windings that make up the compressible portion of the pin element or varying the amplitude or period of the oscillations of the compressible portion. In some embodiments, such design variations may involve changing the pattern of the oscillations (e.g. from semi-sinusoidal to sinusoidal, to square or rectangular, symmetric saw tooth, asymmetric saw tooth, and the like). In other embodiments combination of these variations may be used to achieve a desired spring constant (e.g. compliance) and/or over travel.

Probe elements like those of FIG. 5A may be formed in various orientations. For example, they may be formed from a plurality of stacked layers laying on their sides with layer stacking occurring in the X-direction or Y-direction. If stacking occurs in the Y-direction, the amplitude of oscillations in the compliant elements and the size of stair steps (i.e. resolution) in forming the oscillating elements will dictate the number of layers that must be formed. If stacking occurs in the X-direction, the structure or a plurality of such side by side structures may be formed using as few as two masks and three layers. For example, a first compliant element 104 may be formed on a first layer; the tip 116 and intermediate region between first and second compliant elements, including elements 108 that couple the first and second compliant elements, may be formed on a second layer; and the second compliant element 114 may be formed on a third layer. In a given build area (e.g. four inch circular build area) thousands to tens of thousands of these elements may be formed simultaneously and simply released after formation and then gathered for use. In other embodiments, probes may be formed above one another by adding extra layers to the build.

In still other embodiments, additional compliant probe elements may be used in forming each probe. These additional elements may be added in a linear fashion or in a two-dimensional array pattern. FIG. 5B depicts a top view of an example of a linearly arrayed probe 122 formed of three compliant elements 124-1, 124-2, and 124-3 connected by bridging elements 126-1 and 126-2. FIG. 5C depicts a top view of an example of a two-dimensionally arrayed probe 132 formed of four compliant elements 134-1, 134-2, 134-3, and 134-4 connected by bridging elements 136-1, 136-2, 136-3, and 136-4.

In still other embodiments, the compliant elements forming a probe may be reduced to a single element and in some such embodiments, the masks (e.g. photo masks and/or contact masks) used in producing the probes may be reduced to a single mask.

FIG. 5D shows an example of an alternative structural design for the compliant regions of the pin probe of FIG. 5A. In the example of FIG. 5D, the bridging elements 108 of FIG. 5A have been removed and the symmetric compliant elements 104 and 114 of FIG. 5A have been replaced by asymmetric elements 144-1 and 144-2 having different curvatures between successive bends along the length of the compliant elements. In other embodiments, different symmetric or asymmetric patterns may be designed and fabricated. For example, in some embodiments, the starting and ending points of compliant elements 144-1 and 144-2 may be diagonally opposed on end elements 146 and 148.

FIG. 5E provides a perspective view of an alternative design for the pin probe of FIG. 5A as well as a support structure for the pin probe. The probe 152 shown in FIG. 5C includes non-end regions of solid rod 146-1 and 146-2. The pin is also located in guide plates 148-1 and 148-2 to add stability to the probes. In one approach, the solid sections (e.g. solid rod sections) of the probe 152 may be located in the guide plates, as shown on the upper portion of the figure by 146-1 and 148-1, which reduces risks of wear and provides some enhanced stability. In another approach, the spring or compliant portion of the probe elements may be placed in the guide plates as shown by element 148-2 overlying compliant portion 154 with solid sections located adjacent thereto. This second approach offers enhanced constraining of the probes (i.e. stability) of the probes to a vertical compliance only (i.e. Z-direction compliance) but may raise issues concerning frictional wear and binding between the spring elements and the guide plates.

Figures 6A, 6B:
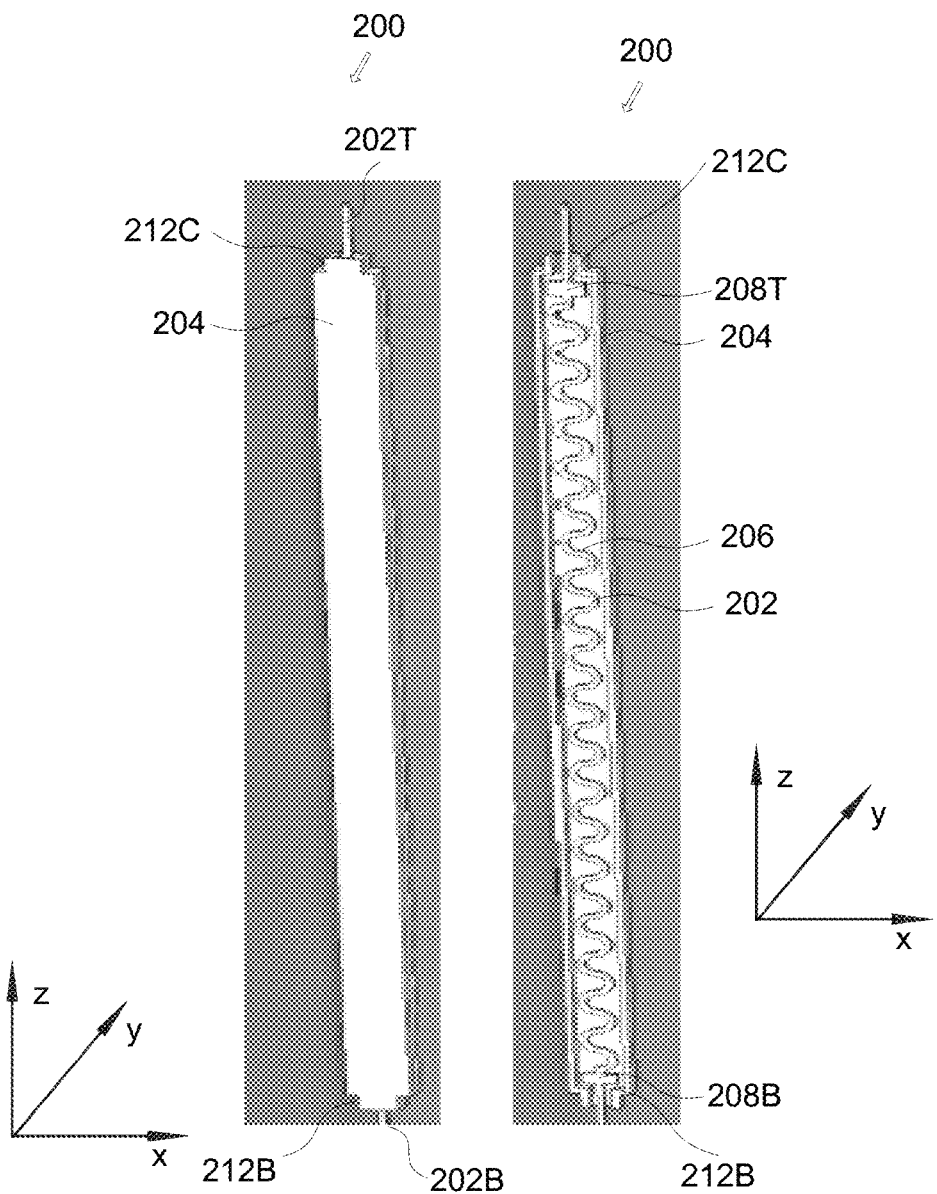
FIG. 6A depicts a probe according to an alternative embodiment of the present invention where the contact and compliant portions of probe are located within a sheath.
FIG. 6B depicts a sectional view of the probe of FIG. 6A.

FIG. 6A depicts a pin probe according to an alternative embodiment of the present invention. In this embodiment a compliant pin probe 200 has contact elements 202B and 202T which extend from the bottom and top of a sheath 204 which surrounds the compliant probe. The sheath is provided to allow the probe to have maximal deflection in the Z direction while limiting deflection in the X and Y dimensions to a minimal amount. The sheath also provides a shorting path along which a signal may be carried such that parasitics are reduced by removing any inductive effects that may be associated with transmitting signals along a curved structure.

FIG. 6B depicts a sectional view of the probe where the front of sheath element 204 is removed and the compliant or pin portion of probe 200 may be seen. As can be seen, the compliant structure consists of a plurality of "S" shaped elements 206. As depicted in FIG. 6B, the compliant structure also includes stop elements 208B and 208T which minimize risk of unintended displacements between the compliant structure 202 and sheath 204. Similarly, sheath 204 includes end elements 212B and 212C which allow seating between the sheath and top and bottom plates in a probe package.

Figure 7A:
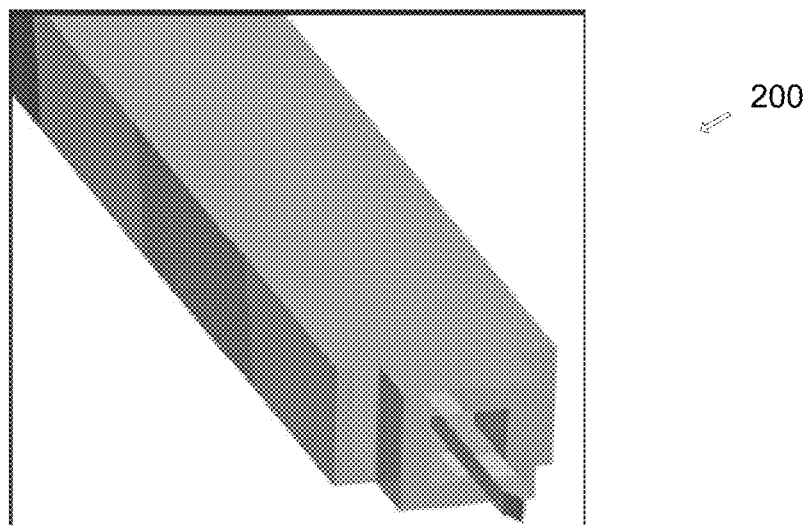
FIGS. 7A and 7B provide close up views of an end element of the probe structure of FIGS. 6A and 6B.
Figure 7B:
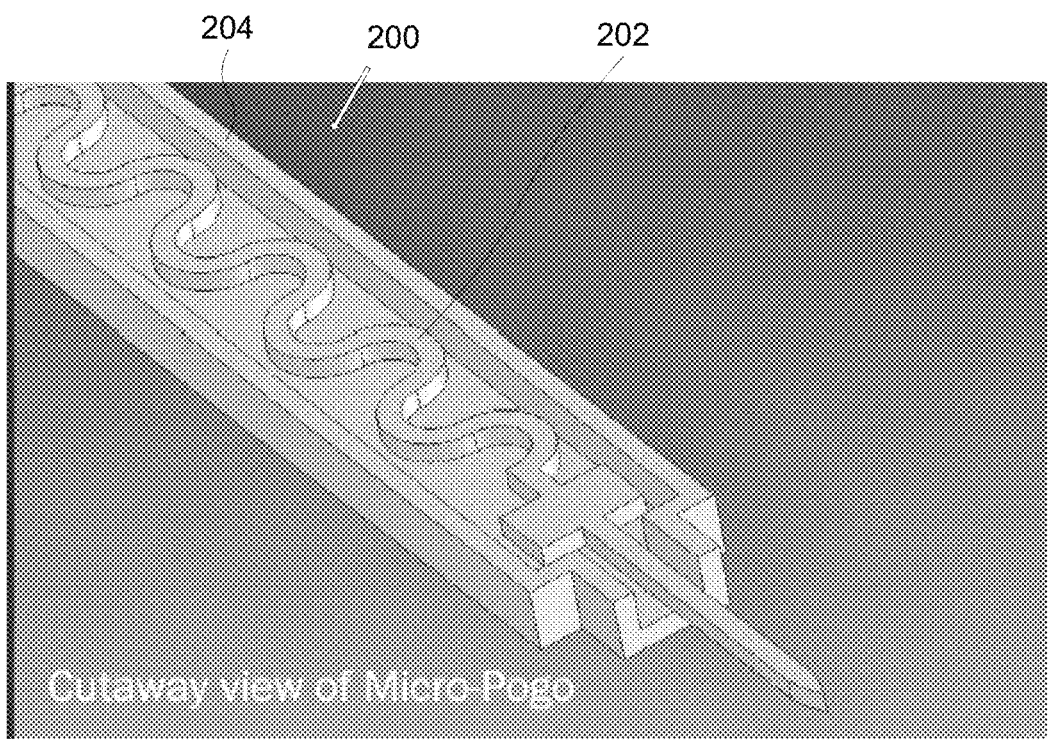

FIGS. 7A and 7B provide close up views of end elements of probe structure 200 wherein a portion of the sheath 204 is removed in the view of FIG. 7B so that pin 202 may be seen.

In fabricating the probe of FIGS. 6A, 6B, 7A, and 7B the pin itself and the sheath may be formed simultaneously. If the probe is formed by building up layers from deposited structural and sacrificial metals and by stacking layers in the Y-direction, the formation of the probe may be reduced to the forming of five layers: (1) a lower flat side (i.e. back) of the sheath, (2) sidewalls of the sheath and a gap of sacrificial material which will separate the pin itself from the lower flat, (3) sidewalls of the sheath and the pin itself, (4) sidewalls of the sheath and a gap of sacrificial material which will separate the pin itself from the upper flat side (i.e. front) of the sheath that will be formed as part of the next layer, and (5) an upper flat side of the sheath. To aid in releasing sacrificial material trapped between the pin and the inside of the sheath, etching holes may be included in the design of the sheath which may allow an etchant to have enhanced access to the inside of the sheath. These etching holes may be included in the sidewalls of the sheath on any or all of the second to fourth layers but it may be more preferable to locate them on the flat surfaces of the sheath on the first and fifth layers so as to minimize risk of the spring protrusions catching on the openings.

Of course, in other embodiments more than five layers may be used in forming a sheathed probe. In still other embodiments, instead of, or in addition to, forming probes with end stops 208B, the pin and the sheath may be attached to one another by a bridging element which is located in the central portion of the length of the probe. The location of the bridging element may be centered relative to the sheath or it may be located off center, for example, to allow greater over travel in one direction or the other. In still other embodiments, the pin need not be permanently located in the sheath but may be removable from one or both ends of the sheath by removing one or both end stops 208B or 208T and/or one or both end elements of the sheath 212B or 212T. In still other embodiments, the pins may take on multi-element forms as discussed in association with FIGS. 5A-5E.

FIGS. 8A-8C depict another example of a sheathed pin probe. In this embodiment, the pin probe is formed from a plurality of rectangular elements. FIG. 8A depicts a partially transparent, perspective view of an end portion of a probe 230 with the pin element 234 located within a sheath 236. The pin element 234 includes a compliant section 242, an end section 244 which in turn includes end stop 246 and tip 248 (as can be seen in FIG. 8B).

FIG. 8B depicts a partially transparent bottom view of the probe of FIG. 8A where the probe is to be built from a plurality of layers 251-262 and where the compliant structure of the pin has elements that extend up and down in a direction (X-direction) perpendicular to the planes of layers (Y-Z planes) from which the probe is formed. As indicated, the probe may be formed from twelve layers of deposited material. If the fabrication occurs with masks having vertical walls, the sloped side surfaces of the probe tip will actually be formed as a series of stair steps 264. As illustrated, the central four layers of the structure may be formed with a smaller layer thickness than that used for the first four layers and the last four layers so that a closer approximation 264 of the sloped tip may be obtained. In other embodiments, a larger layer thickness may be used along with discontinuity reduction operations to smooth the stair steps. Such operations are set forth in U.S. patent application Ser. No. 10/830,262, filed Apr. 21, 2004, by Lockard, and entitled "Methods of Reducing Interlayer Discontinuities in Electrochemically Fabricated Three-Dimensional Structures" which is incorporated herein by this reference as if set forth in full. In still other embodiments, thinner layers may be used to obtain an even more precise rendering of the sloped features. In still other embodiments, different numbers of layers, different thicknesses of layers, different probe tip configurations, and different compliant element configurations may be used in forming a desired structure. FIG. 8C depicts a partially transparent side view of the probe along the X-axis.

In other embodiments, the probe of FIGS. 8A-8C may be fabricated from layers that stack along the Y-direction instead of the X-direction. If the layers are stacked along the Y-direction, the structure may be formed using fewer layers and the tip may be formed with side walls having any desired slope. If formed with layers stacked in the X-direction as shown in FIG. 8B, a larger number of layers are needed. When the fabrication process chosen has a minimum feature size in the plane of building, e.g. due to mask formation limitations (e.g. exposure, development, or the like), it may be possible to build narrower probes by stacking layers in the direction of compliant element oscillation than would be possible by having the compliant element oscillation lay in the plane of the layers. Worded in another way, as (1) the dimension of oscillation of a compliant element may inherently be larger than in the direction which is perpendicular to both it and the axis of the pin and (2) as a minimum dimension of one of the axis of the stacking of layers or of a minimum in-layer feature size will be larger, it may be possible to reduce the overall size (width and thickness) of a probe by building the probe with a compliant member oscillation perpendicular to the larger or the minimum layer thickness or minimum in-layer feature thickness.

Figure 9A:
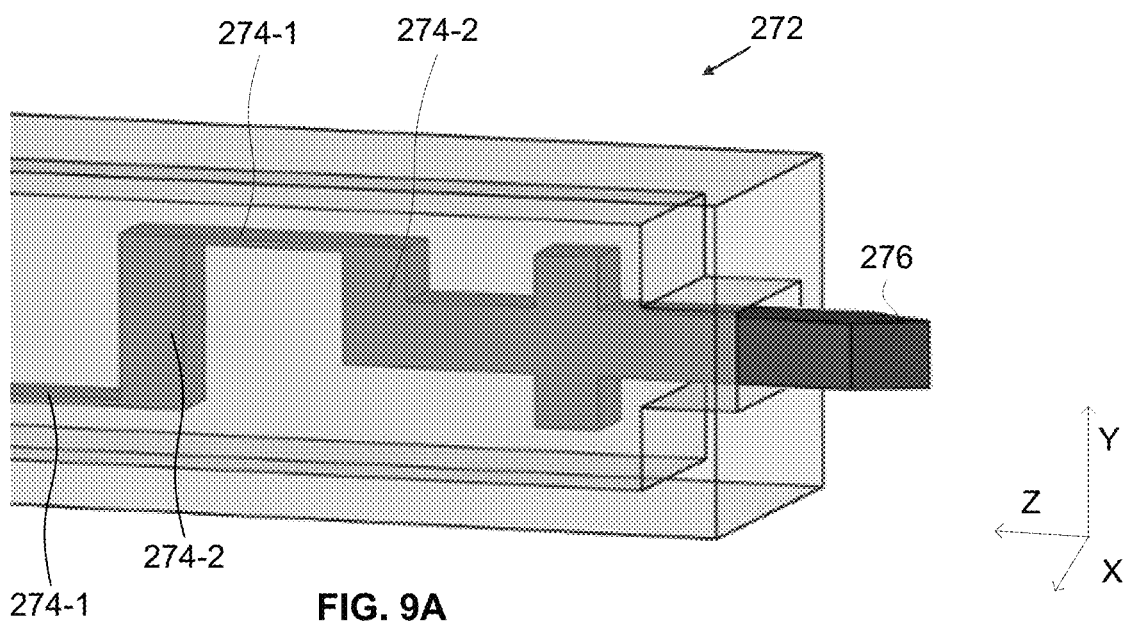
FIGS. 9A-9C depict views similar to those of FIGS. 8A-8C, respectively, for an alternative design of the probe.
Figure 9B:
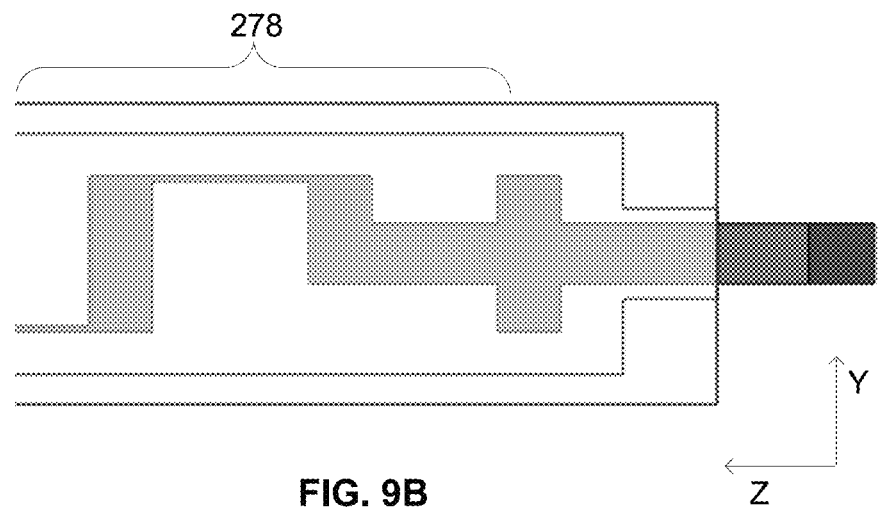
Figure 9C:
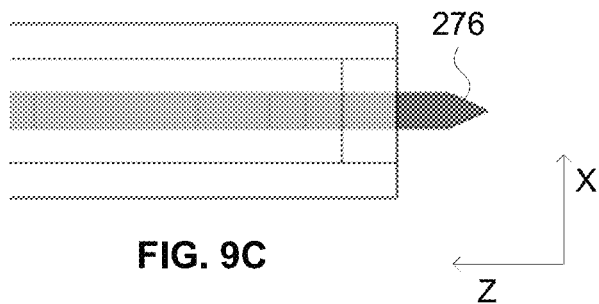

FIGS. 9A-9C depict views similar to those of FIGS. 8A-8C, respectively, for an alternative design of the probe. The probe 272 of FIGS. 9A-9C is similar to that of FIGS. 8A-8C with the following exceptions: (1) the orientation of tapered part 276 of the tip is parallel to the direction (y-direction) of the oscillating of the compliant portion 278 of the pin, (2) the end piece extends to the turn of the first compliant element, and (3) the elements 274-1 of the compliant structure that run in the Z-direction, i.e. direction of the length of the probe, i.e. axis of the pin, are thinner or narrower than the elements 274-2 that extend perpendicular to the axis of the pin.

The probe of FIGS. 9A-9C may be built in any desired orientation (e.g. with the X-direction or Y-direction being the axis of layer stacking). If built using the Y-direction as the stacking direction for layers, the structure may be formed using eleven layers or more while if built with the X-direction as the stacking direction for layers, four layers are needed to form the structure along with one or more intermediate layers for forming the pin and the tip (more than one layer may be needed to form a tip of desired slope). If it is assumed that the minimum feature size is 20 microns, the minimum layer thickness is 2 microns, and that the layers are stacked along the Y-axis, as can be seen in FIG. 9A, the structure can have a width as small as 100 microns in the X-direction and as small as 22 microns in the Y-direction though more width in the X-direction may be desired to allow larger clearances and thicknesses of structural elements and the like. Alternatively, if the structure were formed with the X-direction as the stacking direction the minimum width of the probe would be 220 microns and it is likely that the compliance (e.g. inverse of the spring constant) of the structure would be too small). As such it is believed that a less rectangular probe configurations may be obtained by choosing the building axis (i.e. layer stacking direction) and compliant element oscillation direction (i.e. the part that is perpendicular to the axis of the probe) to be parallel. Furthermore, if the minimum layer thickness is less than the minimum feature thickness it is believed that more compliant probes may be formed by having the compliant element oscillation occur in a direction that is parallel to the layer stacking direction (i.e. the normal to the planes of the layers).

Figure 10A:
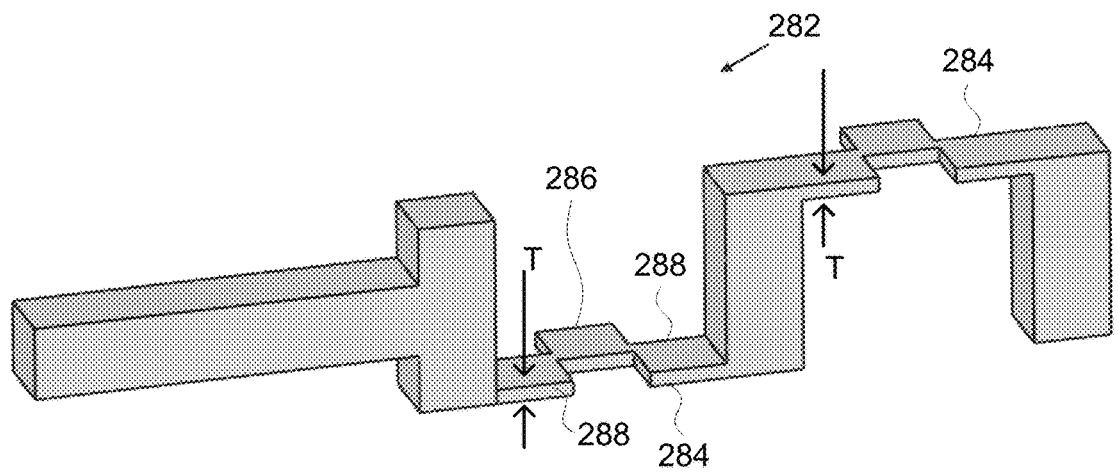
FIG. 10A depicts a perspective view of another alternative design of an end portion of the pin portion of a probe where the compliance of the probe and its asymmetry is increased.

FIG. 10A depicts another alternative design of the pin portion 282 of a probe where the compliance of the probe and its asymmetry is increased. The compliance of the probe is increased by weakening the longitudinal components 284 of the compliant elements (i.e. portions of the compliant region of the pin that extend parallel to the axis of the pin) by making them not only thin, T, but by also effectively narrowing their width to be less than a minimum feature size by using offset elements 286 which have only small overlaps with non-offset portions 288. These offset elements may tend to make the pin not only more compliant along its length but may also make the pin twist. The asymmetry of this design may cause the pin to rub against the side walls and to get stuck. In an alternative embodiment, pairs of offset elements (not shown) may be made to exist with one on each side of non-offset portions 284. Such pairs would still allow increased compliance (at a cost of widening the structure) while removing the asymmetric that could lead to twisting.

Figure 10B:
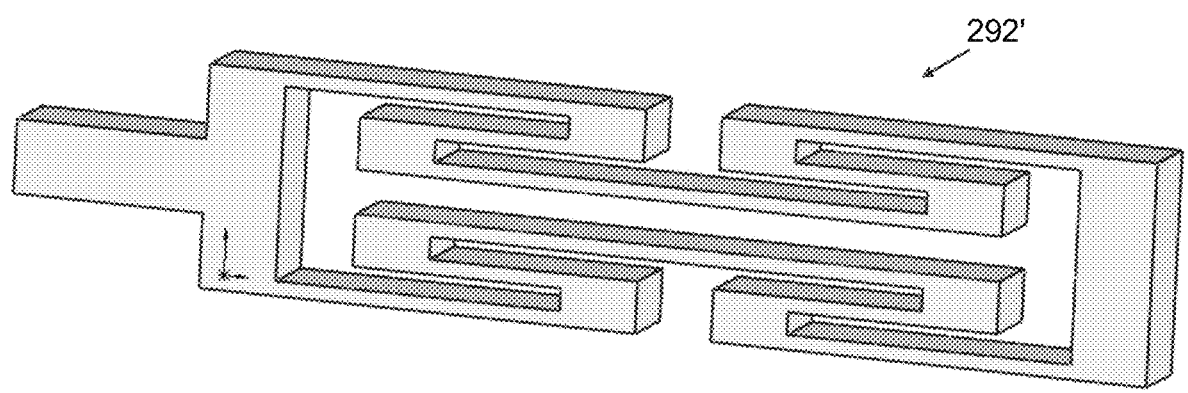
FIGS. 10B and 10C depict perspective views of other alternative designs of an end portion of the pin portion of a probe where the compliant portions of the pins are symmetric along their lengths.
Figure 10C:
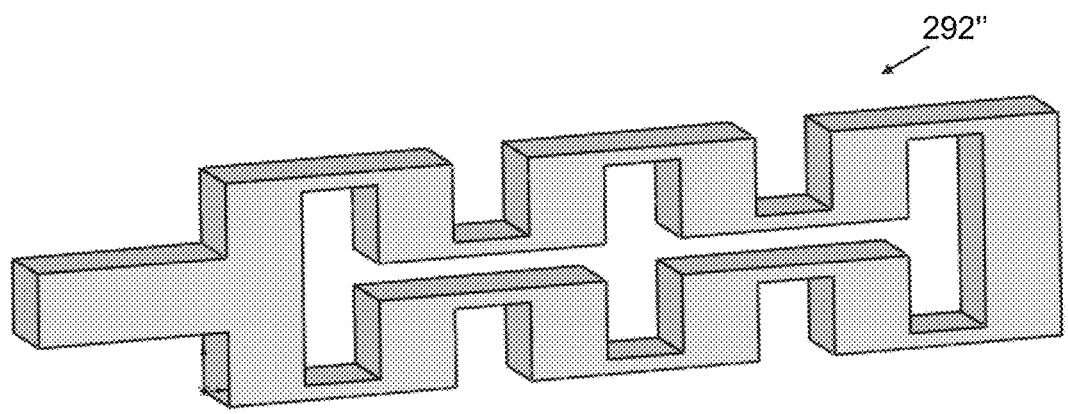

FIGS. 10B and 10C depict perspective views of other alternative designs of an end portion of the pin portion 292' and 292" of a probe where the compliant portions of the pins are symmetric along their lengths.

Figure 10D:
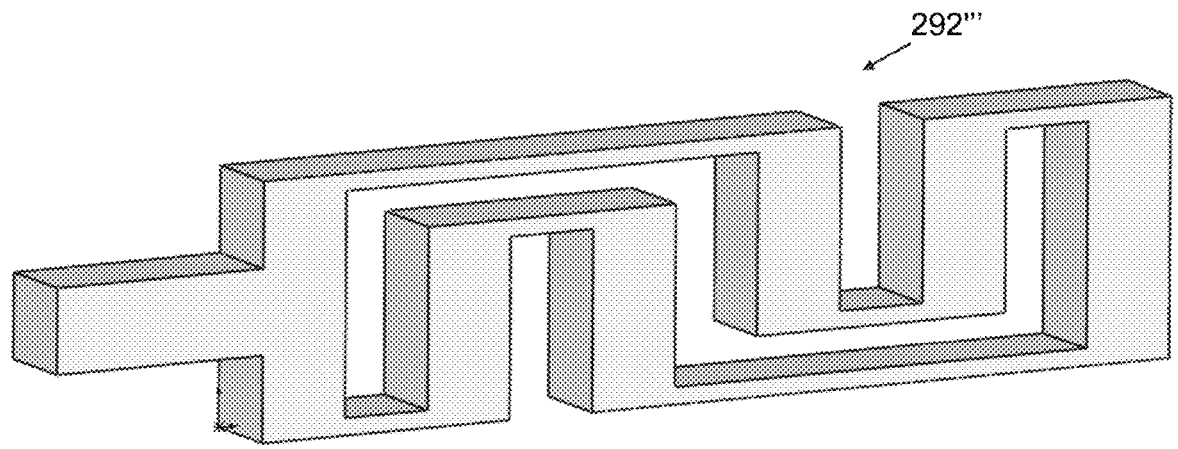
FIG. 10D depicts a perspective view of another alternative design of the end portion of the pin portion of a probe where the compliant portion of the pin over its length has a balanced bending moment.

FIG. 10D depicts a perspective view of another alternative design of the of an end portion of the pin portion 292''' of a probe where the compliant portion of the pin over its length has a balanced bending moment.

Figure 11:
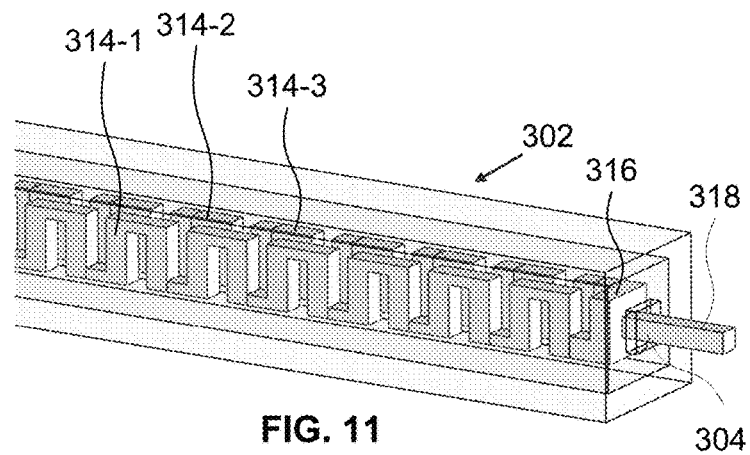
FIG. 11 depicts a partially transparent, perspective view of an end of a pin probe in a sheath where the pin probe has a compliant structure composed of two serpentine springs which are opposite each other so that the total sideways force is balanced.

FIG. 11 depicts a partially transparent, perspective view of an end of a pin probe including a sheath where the pin probe has a compliant structure composed of two serpentine springs which are opposite each other so that the total sideways force is balanced. The probe 302 includes a pin element 304, which includes two compliant elements 314-1 and 314-2 that in extend in parallel with each other and with each of these compliant elements including a plurality of C-shaped or S-shaped compliant elements connected in series with one another. The two elements 314-1 and 314-2 are connected to each other at end stops 316 (the right end stop is shown but not the left). The end stops in turn connect to pin ends 318 (only the right is shown). The tips of end pins 318 may have a desired contact shape which may or may not be different from their cross-sectional shape, they may have contacts elements mounted on them, and/or they may be coated with a special contact material.

In various alternative embodiments, additional compliant elements may added in parallel, multiple tips may exist that the end of each pin end, periodic bridging elements may connect the compliant elements that are located in parallel, the pins may be insertable and/or removable from the sheaths from one or both ends, a central position of the pin may be attached to the sheath, widths and thicknesses of individual compliant elements that are located in series may be varied to achieved different compliances and/or over travel limits, amplitudes and lengths of individual C-shape or S-shape elements may be varied, and the like.

In some embodiments, probes may be formed from a plurality of adhered layers via an electrochemical process. In some embodiments, probes may be formed with the individual C-shaped or S-shaped compliant elements oriented so that their amplitudes extend (oscillate) perpendicular to the planes of the layers or so that they are parallel to the planes of the layers.

Figure 12A:
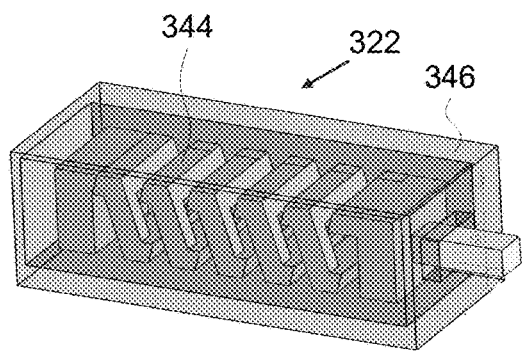
Figure 12B:
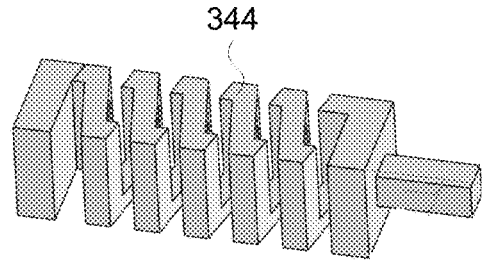
FIG. 12B depicts the pin itself, without the sheath, rotated by 90° about its axis.

Pogo pins with very small cross sections may be stiffer than desired. This may lead to a desire to increase the pin length which in turn can introduce problems such as buckling. Longer springs can be made without increasing the overall length of the probe by increasing the length of the individual compliant elements whose repetition (e.g. C shape or S shaped repeating portions) forms a spring. For example, for a given height of a spring, a spiral of given radius may be longer than an S-shaped element having an amplitude similar to the radius. Such designs can lead to more compliant structures at the cost of increased width. FIG. 12A depicts a partially transparent, perspective view of an end of a pin probe 322 including a compliant pin 344 and a sheath 346 where the pin is in the form of a spiral spring. FIG. 12B depicts the spiral pin 344 without the sheath. In FIG. 12B the pin is rotated by 90° about its axis relative to that of FIG. 12A.

As with the other probe designs set forth herein, in some alternative embodiments the spiral spring probes may be formed from a plurality of adhered layers via an electrochemical fabrication process. As with other probe designs set forth herein, in some alternative embodiments, the probe may be fabricated with the pin in the shield or alternatively the pin and shield may be fabricated separately and then assembled. As with other probe designs set forth herein, in some alternative embodiments, the sheath may be fabricated as two or more separate pieces which are assembled after insertion of a pin. In some alternative embodiments, the spirals may have square or rectangular configurations while in other embodiments they may have oval or circular configurations, in some embodiments the probes may be formed from a plurality of spiraling elements connected serially by central rods, while in still other embodiments the pins may be in the form of double or higher order spirals.

Figures 13A, 13B:
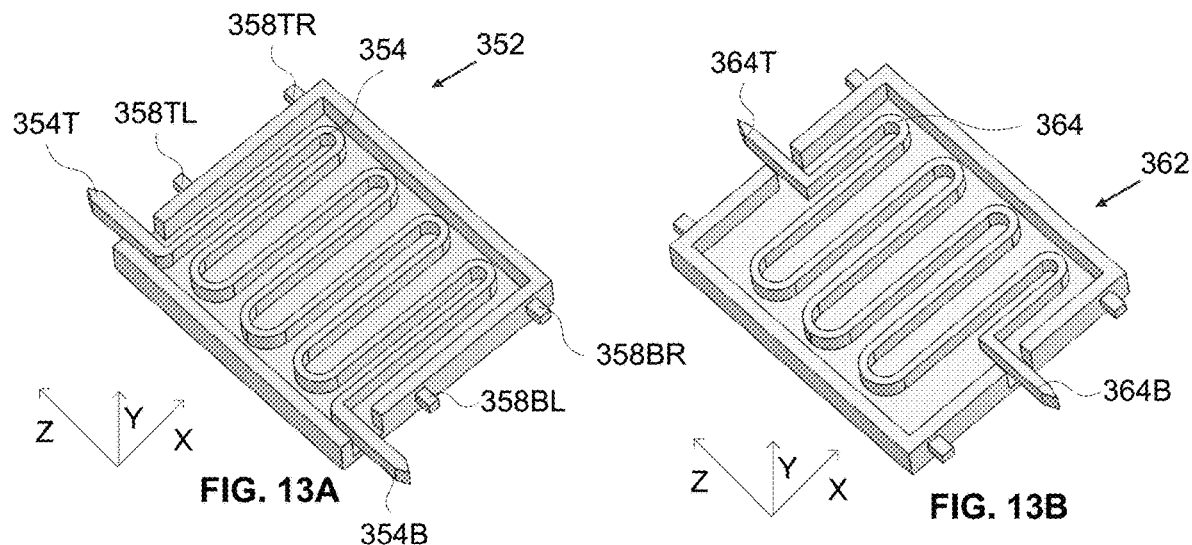

FIGS. 13A and 13B depict perspective sectional views, examples of flattened or rectangular probes 352 and 362 respectively. As with spiral probes, these probes have long length pins but instead of having an ability to form arrays of equal spacing in, for example, the X-direction and Y-direction (assuming the length of the probe extends in the Z-direction), these probes may form tight arrays in, for example, the Y-direction but require larger spacing (i.e. offsets from probe tip to probe tip in the X-direction. To help ensure proper placement of probes in array guides, and the like, the probes may include alignment features such as features 358TR, 358TL, 358BR, and 358BL of probe 352 where the T designation indicates top, the B designation indicates bottom, and the L and R designations indicate left and right respectively.

In the actual probes of this embodiment, the sheaths extend over the exposed spring elements but in alternative embodiments, part of one or both of the front and back of the sheaths may be removed (the remaining portions may be considered front and/or back retention elements). For example, in some embodiments, the front or back of the sheath may consist of one or more relatively narrow beam like retention elements that extend in the Z-direction. In fact, in some embodiments, tighter arrays may be achieved by locating retention elements of adjacent sheaths in different positions so that some overlapping of probe foot prints can occur without the probes touching one another.

The probe 352 of FIG. 13A has both the top and bottom ends 354T and 354B, respectively, of pin 354 extending from the left most side of the sheath while the probe of FIG. 13B has both its top and bottom ends 364T and 364B, respectively, of pin 364 extending from the center of the sheath. In other alternative embodiments, pin tips may extend from different parts of the tops and bottoms of the sheaths. For example, in some embodiments, the top or bottom pin end may extend from the right side of the sheath while the other of the top or bottom pin end may extend from the center of the sheath or from the left side of the sheath.

Figure 13C:
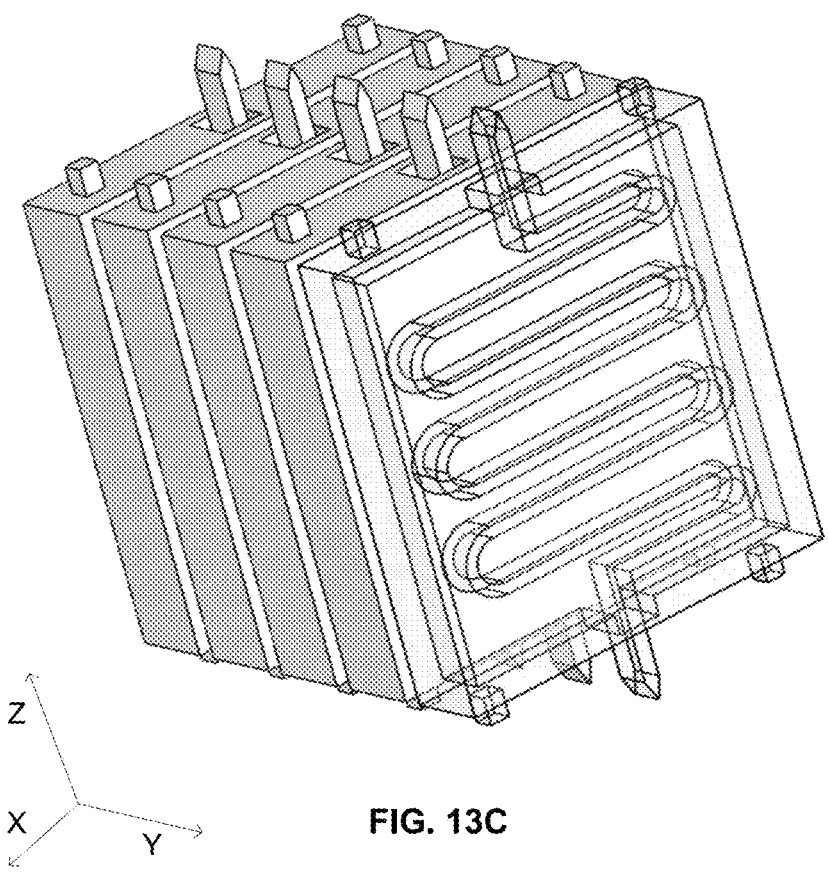
FIG. 13C depicts a perspective view of a linear array of the probes similar to those of FIG. 13B with four shown in solid views and with a front probe shown in a transparent line view and FIG. 13D shows a top view of a 2×4, two-dimensional area of probes similar to those of FIG. 13A.
Figure 13D:
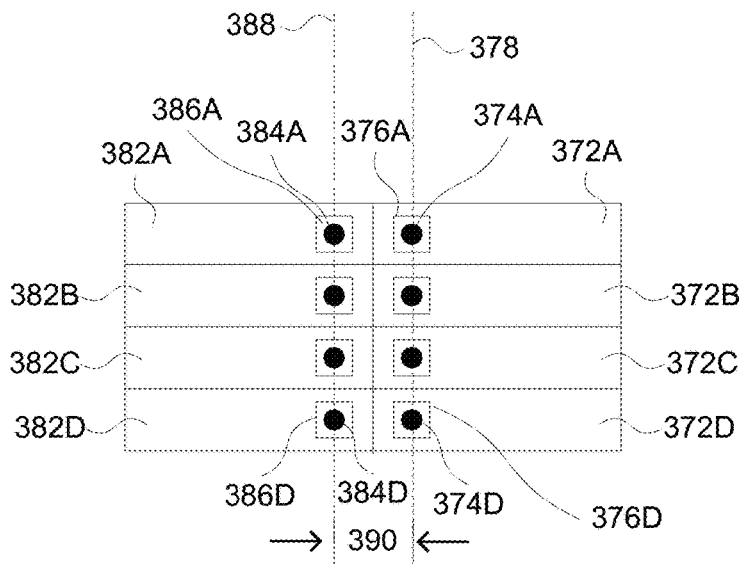

FIG. 13C depicts an example linear array of probe elements. Of course, other one-dimensional and two-dimensional arrays are possible particularly when different top and bottom sheath exit locations are used. For example, two closely spaced lines of probes are possible by using left or right exit locations for pin ends. An example of such an arrangement is shown in FIG. 13D which provides a bottom view of a four-by-two array of rectangular probes 372A-372D and 382A-382D, with tips 384A-384D forming the left line 388 of the array, and tips 374A-374D forming the right line 374 of the array. The probes having openings 376A-376D and 386A-386D in their respective sheaths, from which pins 374A-374D and 384A-384D protrude forming lines 378 and 388 with a spacing of 390.

After fabricating a pogo pin, with the pin located in the sheath, there may be extra movement or "slack" between the end stops of the pins and the sheath and outer sleeve. This slack may result in negative performance issues during use. Also, the spring may plastically deform under the first few cycles, therefore making the "slack" even larger. In such cases, it may be advantageous to have a probe design that allows post formation compressive working of the spring prior to setting the pin's position relative to the sheath. Such probes may include a compliant pin with at least one end tip which may be formed outside the sheath by a greater distance than will exist when the probe is ready for use. The pin may be worked (e.g. compressed) so that it slides into a desired position within the sheath and becomes locked in the sheath with a maximal extension defined by the locking position but with a continued ability to be compliantly compressed.

Figure 14A:
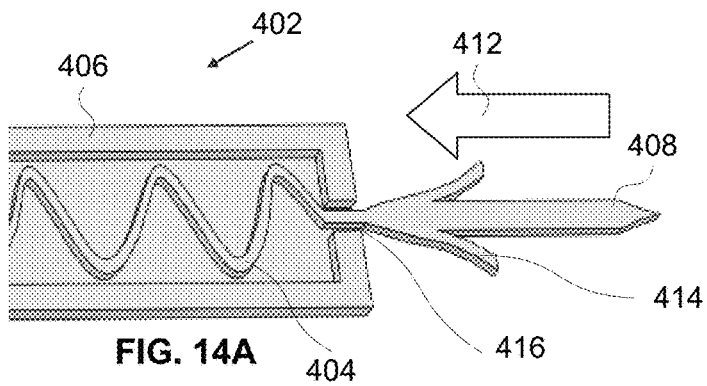
FIGS. 14A and 14B provide perspective views of a pin probe with a locking mechanism such that the pin may be formed in an unloaded and unlocked state (FIG. 14A) having an extended length and/or a narrow element located in the neck of a sheath and thereafter it may be loaded into the sheath and locked (FIG. 14B).
Figure 14B:
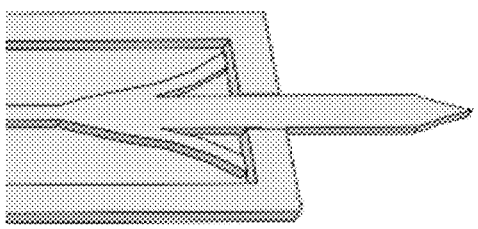

FIGS. 14A and 14B provide perspective sectional views of an example pin probe 402 that includes a compliant pin 404 and a sheath 406. The pin has a tip 408 with a deflectable locking mechanism 414 that can be pushed through an opening 416 in the end of the sheath 406. As indicated in FIG. 14A, the pin may be formed in an unloaded and unlocked state (i.e. with the right tip and locking mechanism located to the right outside the sheath) with a potentially thinner neck portion 410 of the probe located within the opening 416 (e.g. to ensure that minimum feature size limitations are not violated). After formation (e.g. from a plurality of adhered layers built up on a layer-by-layer basis via electrochemical fabrication operations and after removal of any sacrificial material), the compliant pin may be compressed to slide the tip and locking mechanism through the opening 416 as indicated by arrow 412 to lock the pin into the sheath as indicated in FIG. 14B.

Figure 14C:
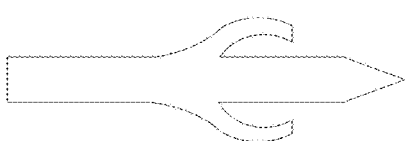
FIG. 14C provides a top end view of a pin element with an alternative compliant lock configuration.

Various alternative embodiments are possible. For example, (1) different compliant structures may be used, (2) protruding tips may extend from one or both ends of the sheath, (3) during formation, one or both ends of the pin may be unloaded, (4) locking mechanisms may take on the same configuration on each end of a probe or may take alternative configurations on opposite ends. Different locking mechanisms may be used. For example, locking mechanisms may have back curving features as indicated in FIG. 14C which may reduce any tendency for the locking mechanism to bind or hang up against a sidewall of the sheath. In some embodiments, it may be advantageous to have the locking mechanism on both ends so that the pin is symmetrical. In such embodiments, pins may be compressed into arrays and then locked into their sheaths. This may occur, for example, by pressing one side into locking position and then pressing the other side into locking position.

Figure 15A:
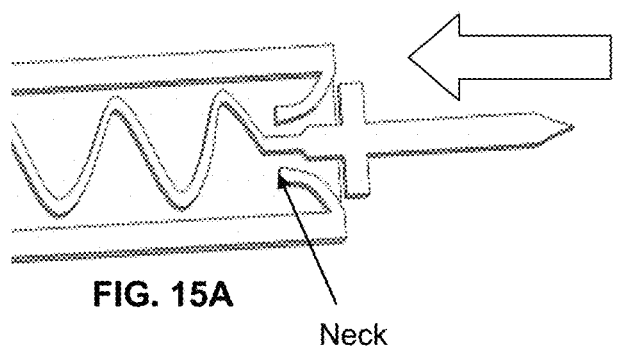
FIGS. 15A and 15B depict perspective views of another alternative lockable pin probe in an unloaded (FIG. 15A) and in a loaded (FIG. 15B) state.
Figure 15B:
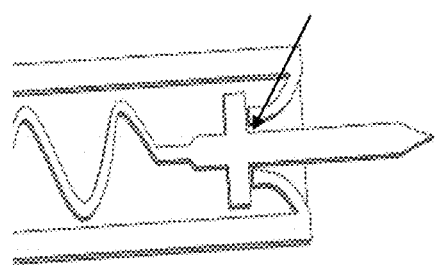

FIGS. 15A and 15B depict perspective views of an alternative lockable pin probe in an unloaded (FIG. 15A) and in a loaded (FIG. 15B) state. A characteristic of this alternative embodiment is that the compliant portion of the locking or latching mechanism is attached to the sheath instead of the pin.

With a multi layer electrochemical fabrication process like that disclosed herein, it is possible to make many different types of pins, sheaths, and tips. These tips may be made from the same material as the rest of a pin or they may be made from different materials. These tips may have a single contact point or multiple contact points. Multiple contact points may be beneficial in some embodiments as they may result in better contact between the pin and the surface that is being probed. Some multi point tips will also be formed to only probe on outside edges of a target such as a solder bump.

Figure 16A:
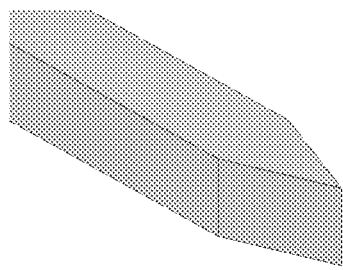
FIGS. 16A-16C depict examples of some alternative single contact point probe tips that may be used in various embodiments of the invention.
Figure 16B:
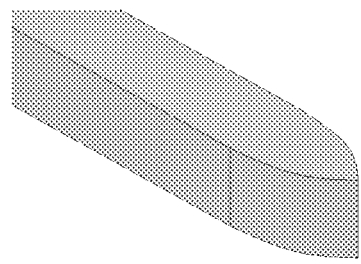
Figure 16C:
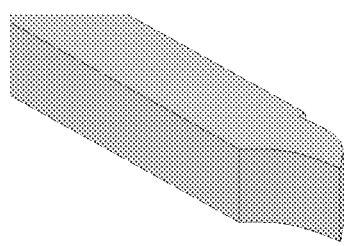
Figure 17A:
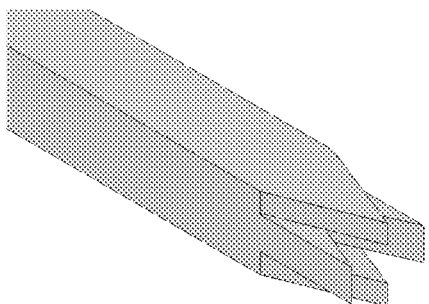
FIGS. 17A-17D depict examples of some alternative multi-contact point probe tips that may be used in various embodiments of the invention.
Figure 17B:
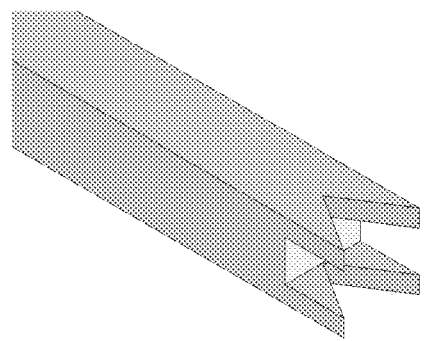
Figure 17C:
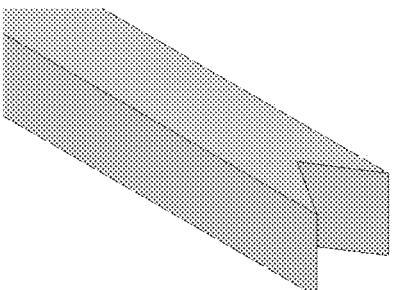
Figure 17D:
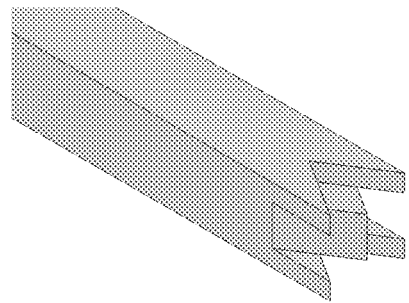

Each layer of a probe tip may have one or more contact points. FIGS. 16A-16C depict examples of some alternative single contact point probe tips that may be used in various embodiments of the invention. These tips can be shaped in many ways. The tip can be symmetrical along a bisecting plane, or it can have different slopes on the two sides. Tips may be formed with smooth slopes as indicated or they may be approximated by stair steps associated with a layer by layer formation process.

FIGS. 17A-17D depict examples of some alternative multi-contact point probe tips that may be used in various embodiments of the invention. Each tip shape on each layer can have a single tip or a plurality of tips that are symmetric with respect to a bisecting plane or can be different. The tips can also be sharp or not sharp depending on the application. Each tip may be formed from one layer or several layers. If the tip is made from several layers, each layer can have a different shape.

Figure 18A:
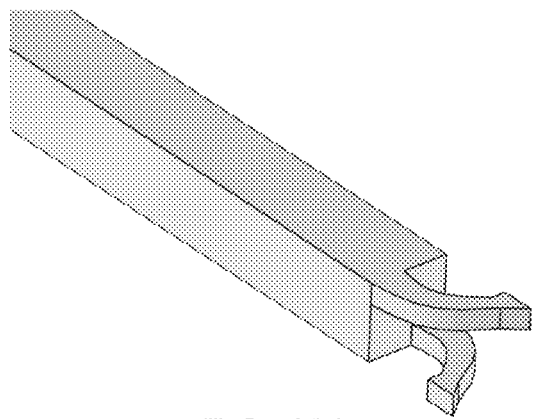
FIGS. 18A-18D depict examples of some alternative probe tips which are of the self scrubbing type and which are of the single or multi-tip type.
Figure 18B:
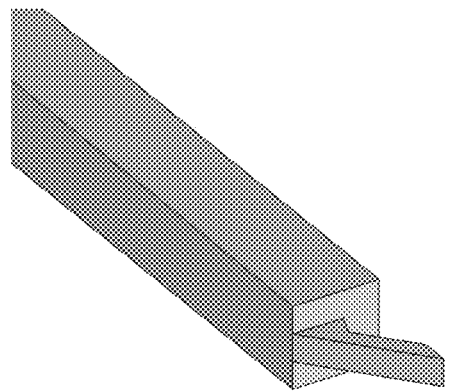
Figure 18C:
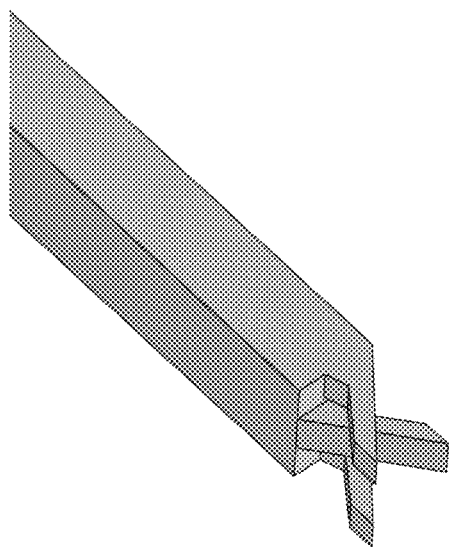
Figure 18D:
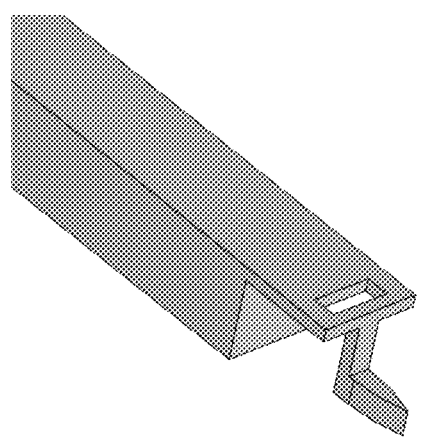

FIGS. 18A-18D depict examples of further alternative probe tips that may be used in various embodiments of the invention. These probe tips are of a self scrubbing type (e.g. as vertical compression of the tip into a target occurs, a horizontal force is developed which can lead to a horizontal displacement of the tip relative to the target resulting in a scrapping or scrubbing action which can help penetrate oxides or other contaminates on the surface of a target or on the tip itself) and they each include one or more contact tips. For example, the tip of FIG. 18A has two tips that scrub in opposite directions as the tip is pressed to a target surface while the tip of FIG. 18C has three tips that scrub in two different directions. The tip of FIG. 18B is a simpler version with a single contact point but which will still tend to have a horizontal deflection as vertical contact is made between the probe and a target surface. The tip of FIG. 18D is also a single tip that will tend to develop a horizontal force as vertical driving of the probe relative to the target occurs.

Various alternative tip embodiments are possible. Some alternative embodiments may include a larger number of contact tips per probe and may include different mechanisms for providing horizontal force or movement. In some embodiments, the tips themselves may not provide a horizontal scrubbing force but instead an entire probe array may undergo a horizontal displacement.

Figure 19:
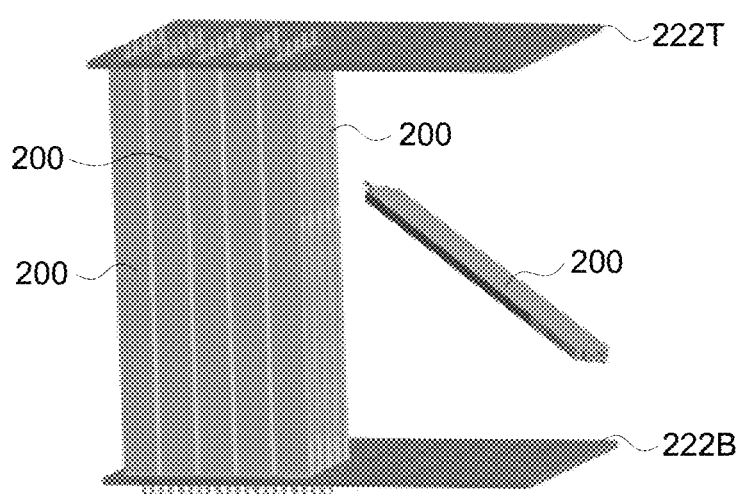
FIG. 19 depicts a perspective view of a partially assembled array of probe elements assembled between an upper and lower plate.

FIG. 19 depicts a plurality of probe elements 200 which have been assembled between plates 222B and 222T which form part of a probe package. FIG. 19 also depicts a probe element 200 which has not yet been inserted into its intended position between plates 222B and 222T.

In some embodiments, it may be possible that the spacing between individual pin probe assemblies 200 when placed in their desired positions between plates 222B and 222T may result in shorting between adjacent pin probes or at least result in an unacceptable risk of shorting between pin probe elements. In such embodiments, it may be desirable to form or locate dielectric elements around individual pin probe sheaths. These dielectric elements may be formed during a layer-by-layer buildup of an electrochemical fabrication process that is used to form the pin probes or alternatively they may be added after layer formation is completed. Dielectric separators may be formed individually around pin probes 200 or may alternatively be used to locate and space apart groups of pin probes.

Dielectric spacing elements may extend over only a portion of the length of sheath elements, such as for example, around central portions of the sheath elements where deflection of sheath elements may be greatest as a result of stress induced by the compliant portions of the pin probes when compressed or by non-uniformities or excess forces involved in plates 222B and 222T holding the probe elements in place.

Figure 20:
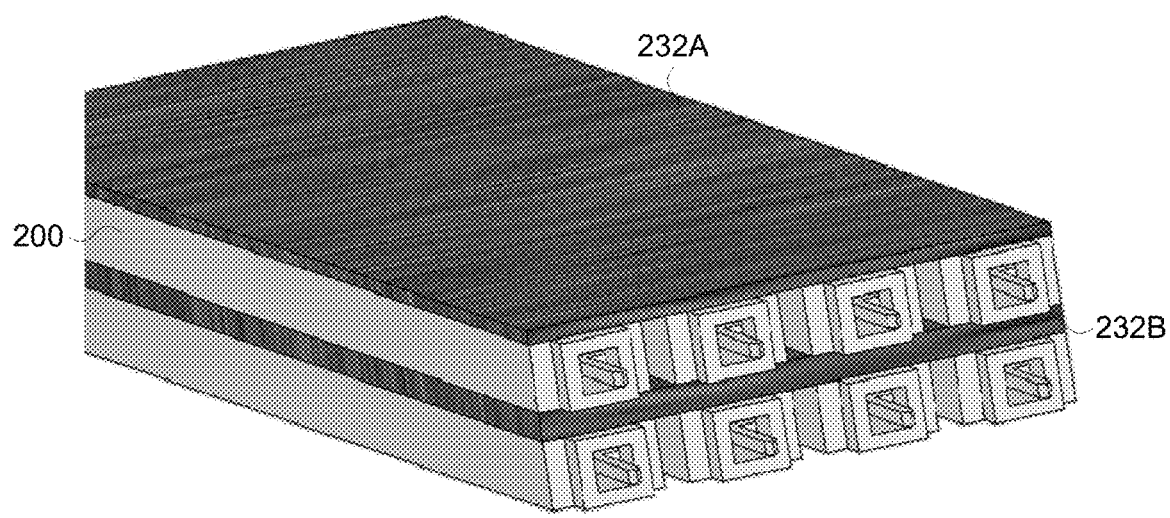
FIG. 20 depicts a perspective view of a grouping of pin probe elements 200 which are separated by and held into position by dielectric sheaths.

FIG. 20 depicts a grouping of pin probe elements 200 which are separated by and held into position by dielectric sheaths 232A and 232B.

In some situations, it may be advantageous to form pin probes in linear or two-dimensional arrays of desired spacing so as to make transfer of probes from a build environment to a use environment simpler and more straight forward. For example, it may be much simpler to load ten groups of one hundred probes each into a guide plate than to load one thousand probes individually into such a plate.

Figures 21A, 21B, 21C:
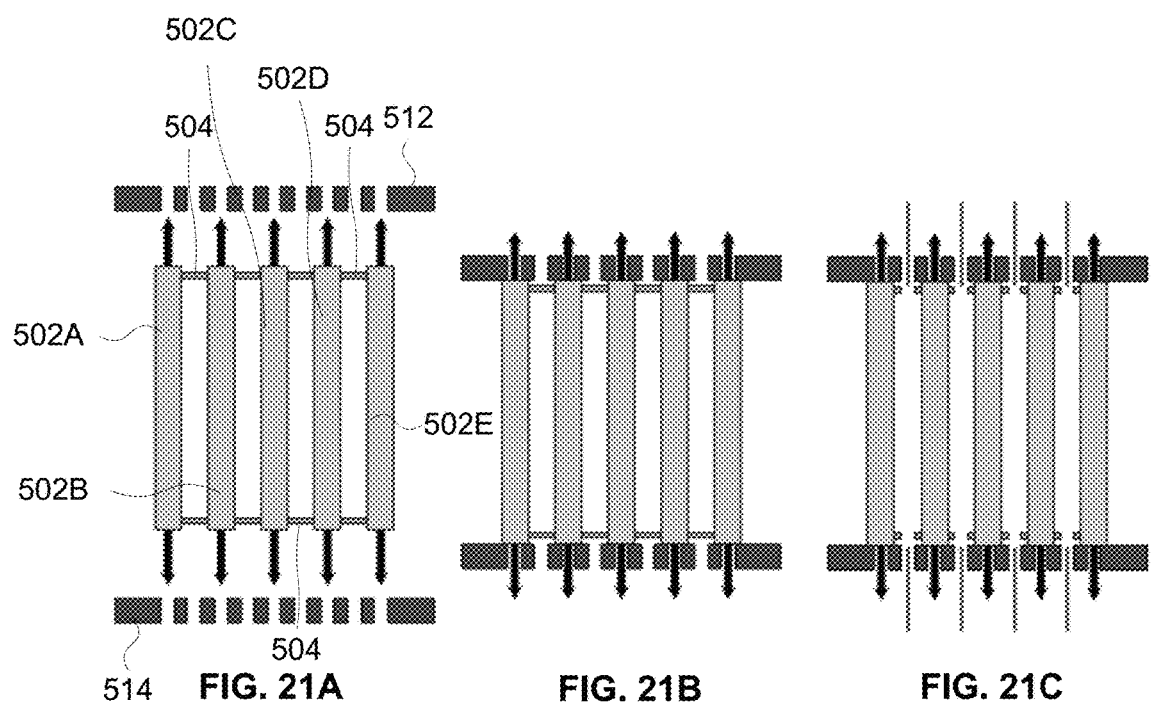
FIGS. 21A-21C depict side views of various states of a process of loading groups of conductively bridged probes into retention plates and then removing the bridges.

FIGS. 21A-21C depict side views of various states of a process for loading groups into a guide. In this embodiment, the probes are joined to one another by conductive bridges which must be removed prior to use. Instead of assembling pin probes one by one, large groups of pins are fabricated at once according to this embodiment, assembled, and then detached using a laser or any other method that cuts material. In this embodiment, pin probes (including pins and sheaths) are fabricated lying down with small bridges connecting the probes together. The groups of pins can be in 1D rows or in 2D arrays. The lines/arrays of pins are assembled in guide plates and are later detached with a laser or any other cutting method.

FIG. 21A depicts the state of the process after probes 502A-502E have been fabricated with attached bridges 504 that space the probes at a desired pitch and after top and bottom guide plates 512 and 514 have been positioned in proximity to the probe ends. The guide plates have an array of holes of similar pitch to that of the probes and having a second array of holes that allow access to bridge elements once the probes have been located relative to the plates. The secondary array of holes allows a laser beam to strike and break the bridging elements. FIG. 21B depicts the state of the process after pin probes and the guide plates have been assembled together. FIG. 21C depicts the state of the process after a laser beam has been used to break the bridges.

In alternative embodiments, the bridging elements may be formed from a dielectric material and thus may remain in place after assembly of the guide plates and the probes, thereby eliminating the need for the second array of holes and the need for a laser ablation operation. In still other embodiments, the bridge elements may be made from a high resistance material or materials and a high current may be passed between probe sheaths to cause heating and destruction of the bridging elements.

The various embodiments discussed hereinafter concerning incorporation of dielectric materials into electrochemical fabrication processes may be used to locate the dielectric materials in desired locations. Alternatively, back filling of dielectric material into partially released or fully released probe arrays (which are held in appropriate positions) may be used.

In still other alternative embodiments, it may be possible to locate dielectric material onto the probe elements or at least selected portions of probe elements by a sputtering process or other PVD or CVD process.

In still other alternative embodiments the compliant portions of the probe structures may take on other configurations than those set forth in the above described embodiments. For example, the structures need not be substantially planar structures as shown. They may be formed from multiple layers of structural material. The multiple layers of material may have similar patterning and may be formed simply to increase the spring constant of the compliant structure or they may have different patterns which may tend to increase spring constant, or not, and which may tend to balance compressional forces to minimize unintended X and Y direction deflections during compression.

In still other embodiments, the entire length of the probe structure within the sheath need not be of a compliant design but instead may have portions which are non-compliant similar to the non-compliant portions discussed in association with FIG. 5C. In some embodiments, one or both stop elements 208B and 208T may be removed. In some embodiments, a structure may firmly attach the compliant portion of the probe element to the sheath (e.g. a central portion of the compliant element).

In still other embodiments, the sheath may include one or more slots or other openings in it (for example, on the front or back surfaces) which may enhance the ability to remove a sacrificial material from the region between an enclosed compliant element and the sheath. In some embodiments, a structure may be affixed to the compliant element (e.g. in a central portion) which fits into one or more slots in the sheath and allows the compliant element to move vertically in the sheath a predefined amount.

In still other embodiments, depending on the desired compressibility of the compliant element and the spacing between adjacent repeating features of the compliant structure, it may be possible to mount stop elements on the inside walls of the sheath which allow some vertical movement of the compliant member while still retaining it within a desired position.

In still other embodiments, pin probe structures may provide a compliant tip at only one end of a sheath while electrical contact to a non-compliant end may be made by solder bonding, wire bonding, diffusion bonding, ultrasonic welding, brazing, or the like. Alternatively bonding to the noncompliant end may simply occur as a result of pressure from mating the compliant end to a contact location.

Still other embodiments may be created by combining the various embodiments and their alternatives which have been set forth herein with other embodiments and their alternatives which have been set forth herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al. which is entitled "Method of Electrochemically Fabricating Multilayer Structures Having Improved Interlayer Adhesion" and which is hereby incorporated herein by reference as if set forth in full.

Further teachings about microprobes and electrochemical fabrication techniques are set forth in a number of US patent applications: (1) U.S. Patent Application No. 60/533,975 by Kim et al., which was filed on Dec. 31, 2003, and which is entitled "Microprobe Tips and Methods for Making"; (2) U.S. Patent Application No. 60/533,947 by Kumar et al., which was filed on Dec. 31, 2003, and which is entitled "Probe Arrays and Method for Making"; (3) U.S. Patent Application No. 60/574,737 by Cohen et al., which was filed May 26, 2004, and which is entitled "Electrochemical Fabrication Method for Fabricating Space Transformers or Co-Fabricating Probes and Space Transformers"; (4) U.S. Patent Application No. 60/533,897 by Cohen et al. which was filed on Dec. 31, 2003, and which is entitled "Electrochemical Fabrication Process for Forming Multilayer Multimaterial Microprobe structures"; (5) U.S. Patent Application No. 60/540,511 by Kruglick et al, which was filed on Jan. 29, 2004, and which is entitled "Electrochemically Fabricated Microprobes", (6) U.S. patent application Ser. No. 10/772,943, by Arat et al., which was filed Feb. 4, 2004, and which is entitled "Electrochemically Fabricated Microprobes"; (7) U.S. Patent Application No. 60/582,690, filed Jun. 23, 2004, by Kruglick, and which is entitled "Cantilever Microprobes with Base Structures Configured for Mechanical Interlocking to a Substrate"; and (8) U.S. Patent Application No. 60/582,689, filed Jun. 23, 2004 by Kruglick, and which is entitled "Cantilever Microprobes with Improved Base Structures and Methods for Making the Same". These patent filings are each hereby incorporated herein by reference as if set forth in full herein.

The techniques disclosed explicitly herein may benefit by combining them with the techniques disclosed in U.S. patent application Ser. No. 11/028,960 filed Jan. 3, 2005 by Chen et al. and entitled "Cantilever Microprobes For Contacting Electronic Components and Methods for Making Such Probes" (Corresponding to Microfabrica Docket No. P-US140-A-MF); U.S. Patent Application No. 60/641,341 filed Jan. 3, 2005 by Chen et al. and entitled "Vertical Microprobes for Contacting Electronic Components and Method for Making Such Probes" (corresponding to Microfabrica Docket No. P-US129-A-MF); U.S. patent application Ser. No. 11/029,217 filed Jan. 3, 2005 by Kim et al. and entitled "Microprobe Tips and Methods For Making" (corresponding to Microfabrica Docket No. P-US122-A-MF); U.S. patent application Ser. No. 11/028,958 filed Jan. 3, 2005 by Kumar et al. and entitled "Probe Arrays and Methods for Making" (corresponding to Microfabrica Docket No. P-US123-A-MF); and U.S. patent application Ser. No. 11/029,221 filed Jan. 3, 2005 by Cohen et al. and entitled "Electrochemical Fabrication Process for Forming Multilayer Multimaterial Microprobe Structures" (corresponding to Microfabrica Docket No. P-US138-A-MF).

Further teachings about planarizing layers and setting layers thicknesses and the like are set forth in the following US patent applications which were filed Dec. 31, 2003: (1) U.S. Patent Application No. 60/534,159 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 by Cohen et al. and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

The techniques disclosed explicitly herein may benefit by combining them with the techniques disclosed in U.S. patent application Ser. No. 11/029,220 filed Jan. 3, 2005 by Frodis et al. and entitled "Method and Apparatus for Maintaining Parallelism of Layers and/or Achieving Desired Thicknesses of Layers During the Electrochemical Fabrication of Structures" (corresponding to Microfabrica Docket No. P-US132-A-MF).

Additional teachings concerning the formation of structures on dielectric substrates and/or the formation of structures that incorporate dielectric materials into the formation process and possibility into the final structures as formed are set forth in a number of patent applications: (1) U.S. Patent Application No. 60/534,184, by Cohen, which was filed on Dec. 31, 2003, and which is entitled "Electrochemical Fabrication Methods Incorporating Dielectric Materials and/or Using Dielectric Substrates"; (2) U.S. Patent Application No. 60/533,932, by Cohen, which was filed on Dec. 31, 2003, and which is entitled "Electrochemical Fabrication Methods Using Dielectric Substrates"; (3) U.S. Patent Application No. 60/534,157, by Lockard et al., which was filed on Dec. 31, 2004, and which is entitled "Electrochemical Fabrication Methods Incorporating Dielectric Materials"; (4) U.S. Patent Application No. 60/574,733, by Lockard et al., which was filed on May 26, 2004, and which is entitled "Methods for Electrochemically Fabricating Structures Using Adhered Masks, Incorporating Dielectric Sheets, and/or Seed Layers that are Partially Removed Via Planarization"; and U.S. Patent Application No. 60/533,895, by Lembrikov et al., which was filed on Dec. 31, 2003, and which is entitled "Electrochemical Fabrication Method for Producing Multi-layer Three-Dimensional Structures on a Porous Dielectric". These patent filings are each hereby incorporated herein by reference as if set forth in full herein.

The techniques disclosed explicitly herein may benefit by combining them with the techniques disclosed in U.S. patent application Ser. No. 11/029,216 filed Jan. 3, 2005 by Cohen et al. and entitled "Electrochemical Fabrication Methods Incorporating Dielectric Materials and/or Using Dielectric Substrates" (corresponding to Microfabrica Docket No. P-US128-A-MF) and U.S. Patent Application No. 60/641,292 filed Jan. 3, 2005 herewith by Dennis R. Smalley and entitled "Method of Forming Electrically Isolated Structures Using Thin Dielectric Coatings" (corresponding to Microfabrica Docket No. P-US121-A-MF).

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S. patent application Ser. No., Filing Date U.S. App Pub No., Pub Date U.S. Pat. No., Pub Date | First Named Inventor, Title |
|---|---|
| 09/493,496-Jan. 28, 2000 — 6,790,377-Sep. 14, 2004 | Cohen, "Method For Electrochemical Fabrication" |
| 10/677,556-Oct. 1, 2003 2004-0134772-Jul. 15, 2004 — | Cohen, "Monolithic Structures Including Alignment and/or Retention Fixtures for Accepting Components" |
| 10/830,262-Apr. 21, 2004 2004-0251142-Dec. 16, 2004 7,198,704-Apr. 3, 2007 | Cohen, "Methods of Reducing Interlayer Discontinuities in Electrochemically Fabricated Three-Dimensional Structures" |
| 10/271,574-Oct. 15, 2002 2003-0127336-Jul. 10, 2003 7,288,178-Oct. 30, 2007 | Cohen, "Methods of and Apparatus for Making High Aspect Ratio Microelectromechanical Structures" |

-continued

| U.S. patent application Ser. No., Filing Date U.S. App Pub No., Pub Date U.S. Pat. No., Pub Date | First Named Inventor, Title |
|---|---|
| 10/697,597-Dec. 20, 2002 2004-0146650-Jul. 29, 2004 — | Lockard, "EFAB Methods and Apparatus Including Spray Metal or Powder Coating Processes" |
| 10/677,498-Oct. 1, 2003 2004-0134788-Jul. 15, 2004 7,235,166-Jun. 26, 2007 | Cohen, "Multi-cell Masks and Methods and Apparatus for Using Such Masks To Form Three-Dimensional Structures" |
| 10/724,513-Nov. 26, 2003 2004-0147124-Jul. 29, 2004 7,368,044-May 6, 2008 | Cohen, "Non-Conformable Masks and Methods and Apparatus for Forming Three-Dimensional Structures" |
| 10/607,931-Jun. 27, 2003 2004-0140862-Jul. 22, 2004 7,239,219-Jul. 3, 2007 | Brown, "Miniature RF and Microwave Components and Methods for Fabricating Such Components" |
| 10/841,100-May 7, 2004 2005-0032362-Feb. 10, 2005 7,109,118-Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958-Mar. 13, 2003 2003-022168-Dec. 4, 2003 — | Cohen, "Electrochemical Fabrication Method and Application for Producing Three-Dimensional Structures Having Improved Surface Finish" |
| 10/434,494-May 7, 2003 2004-0000489-Jan. 1, 2004 — | Zhang, "Methods and Apparatus for Monitoring Deposition Quality During Conformable Contact Mask Plating Operations" |
| 10/434,289-May 7, 2003 20040065555-Apr. 8, 2004 — | Zhang, "Conformable Contact Masking Methods and Apparatus Utilizing In Situ Cathodic Activation of a Substrate" |
| 10/434,294-May 7, 2003 2004-0065550-Apr. 8, 2004 — | Zhang, "Electrochemical Fabrication Methods With Enhanced Post Deposition Processing" |
| 10/434,295-May 7, 2003 2004-0004001-Jan. 8, 2004 — | Cohen, "Method of and Apparatus for Forming Three-Dimensional Structures Integral With Semiconductor Based Circuitry" |
| 10/434,315-May 7, 2003 2003-0234179-Dec. 25, 2003 7,229,542-Jun. 12, 2007 | Bang, "Methods of and Apparatus for Molding Structures Using Sacrificial Metal Patterns" |
| 10/434,103-May 7, 2004 2004-0020782-Feb. 5, 2004 7,160,429-Jan. 9, 2007 | Cohen, "Electrochemically Fabricated Hermetically Sealed Microstructures and Methods of and Apparatus for Producing Such Structures" |
| 10/841,006-May 7, 2004 2005-0067292-May 31, 2005 — | Thompson, "Electrochemically Fabricated Structures Having Dielectric or Active Bases and Methods of and Apparatus for Producing Such Structures" |
| 10/434,519-May 7, 2003 2004-0007470-Jan. 15, 2004 7,252,861-Aug. 7, 2007 | Smalley, "Methods of and Apparatus for Electrochemically Fabricating Structures Via Interlaced Layers or Via Selective Etching and Filling of Voids" |
| 10/724,515-Nov. 26, 2003 2004-0182716-Sep. 23, 2004 7,291,254-Nov. 6, 2007 | Cohen, "Method for Electrochemically Forming Structures Including Non-Parallel Mating of Contact Masks and Substrates" |
| 10/841,347-May 7, 2004 2005-0072681-Apr. 7, 2005 | Cohen, "Multi-step Release Method for Electrochemically Fabricated Structures" |
| 10/841,300-May 7, 2004 2005 0032375-Feb. 10, 2005 — | Cohen, "Methods for Electrochemically Fabricating Structures Using Adhered Masks, Incorporating Dielectric Sheets, and/or Seed layers That Are Partially Removed Via Planarization" |
| 60/603,030-Aug. 19, 2004 — | Cohen, "Integrated Circuit Packaging Using Electrochemically Fabricated Structures" |
| 60/641,341-Jan. 3, 2005 — | Chen, "Electrochemically Fabricated Microprobes" |

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented embodiments. These additional operations may, for example, perform cleaning functions (e.g. between the primary operations discussed above), they may perform activation functions and monitoring functions.

It will also be understood that the probe elements of some aspects of the invention may be formed with processes which are very different from the processes set forth herein and it is not intended that structural aspects of the invention need to be formed by only those processes taught herein or by processes made obvious by those taught herein.

Many other alternative embodiments will be apparent to those of skill in the art upon reviewing the teachings herein. Further embodiments may be formed from a combination of the various teachings explicitly set forth in the body of this application. Even further embodiments may be formed by combining the teachings set forth explicitly herein with teachings set forth in the various applications and patents referenced herein, each of which is incorporated herein by reference.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. An improved method of forming a multi-layer three-dimensional pin probe including a pin element comprising at least one multi-turn compliant element and at least one tip element, comprising: (A) forming a plurality of successive multi-material layers with each successive multi-material layer adhered to a previously formed multi-material layer and with each successive multi-material layer comprising at least two materials, at least one of which is at least one structural material and at least one other of which is at least one sacrificial material, and wherein each successive multi-material layer defines a successive cross-section of the pin probe, and wherein the forming of each of the plurality of successive multi-material layers comprises: (i) depositing at least a first of the at least two materials; (ii) depositing a second of the at least two materials; (iii) planarizing at least two of the at least two deposited materials, including planarizing at least one structural material and at least one sacrificial material; and (B) after the forming of the plurality of successive multi-material layers, removing at least a portion of the at least one sacrificial material from the at least one structural material to reveal the at least partially completed pin probe formed from the at least one structural material, wherein the improvement comprises:

wherein the pin element has a longitudinal axis corresponding to a primary compliance direction of the pin probe and normal to planes of the plurality of adhered layers, and wherein a sheath of the pin probe and the pin element are formed together from the plurality of multi-material layers with at least a portion of the pin element located within an interior of the sheath prior to removal of the sacrificial material and with the pin element being longitudinally compressible and at least partially compliantly moveable within the interior of the sheath after removal of at least a portion of the at least one sacrificial material.

2. The method of claim 1 wherein at least one of the at least one structural material comprises a metal and wherein at least one of the at least one sacrificial material comprises a metal.

3. The method of claim 1 wherein the forming of each of the plurality of layers comprises performing both patterned and blanket depositions of materials.

4. The method of claim 3 wherein at least a portion of the depositions comprise electroplating operations.

5. The method of claim 1 wherein the pin element of the pin probe comprises a first material forming at least a portion of a compliant multi-turn element of the pin element and a second material, different from the first material, forming a contact portion of the at least one contact tip element.

6. The method of claim 1 where the pin element comprises a portion formed with a shell of structural material surrounding a core of a different structural material.

7. The method of claim 1 wherein the at least one pin element comprises a first locking element and the sheath comprises a second locking element with at least one of the first locking element and the second locking element comprising a compliant element wherein the first and second locking elements are configured to allow a portion of the pin element and the sheath to relatively slide past one another in a first direction from a build position to working position and thereafter to inhibit motion when moving in a second direction opposite to the first direction beyond a predefined limit, and wherein the first direction moves a contact portion of the at least one contact tip from a position further from the sheath to a position closer to the sheath.

8. The method of claim 1 wherein during formation of the plurality of layers, at least one of the at least one tip element is located in a build location relative to the sheath, and wherein after removal of at least a portion of the sacrificial material the at least one of the at least one tip element is relatively moved to a position closer to the sheath within a working range of compliance to engage at least one locking element so that the at least one of the at least one tip element cannot inadvertently be extended back to build location but may freely move within the working range of compliance.

9. The method of claim 8 wherein the at least one tip element comprises at least two tip elements, with one located on each of two opposite ends of the pin probe and wherein both of the at least two tip elements are moved from respective build locations to positions closer to the sheath within respective working ranges of compliance.

10. The method of claim 1 wherein the at least one multi-turn element comprises at least two multi-turn elements located in series joined by a non-compliant non-multiturn intermediate element.

11. The method of claim 1 wherein the pin element is attached to the sheath at at least one intermediate location.

12. The method of claim 1 wherein the pin element has a feature that extends into an opening in the sheath that allows some longitudinal movement of the pin element relative to the sheath but inhibits the pin element from completely moving out of the interior of the sheath.

13. The method of claim 1 wherein the at least one multi-turn element comprises at least two multi-turn elements located in parallel.

14. The method of claim 1 wherein the sheath includes at least one non-tip opening extending from an exterior to an interior of the sheath.

15. The method of claim 1 wherein the at least one tip element comprises at least two tip elements with at least one tip located at each end of the pin element.

16. The method of claim 1 wherein the multi-turn compliant element has a length and an orientation of turning elements that define a plane and the at least one tip element has a tapered configuration wherein the taper lies in a plane with a different orientation than the plane containing the multiturn element.

17. The method of claim 1 wherein the multi-turn compliant element has a length and an orientation of turning elements that define a plane and a stacking direction of the plurality of layers lies parallel to a direction within the plane containing the turning elements of the compliant portion of the pin element.

18. The method of claim 1 wherein the sheath contains at least one structure that is not attached to the pin element and that acts as a stop element that retains the pin element from leaving the sheath.

19. The method of claim 1 additionally comprising locating a dielectric material on at least a portion of an outer surface of the sheath.

20. A pin probe for making electrical contact to an electronic circuit element, comprising:
   (A) a pin element, comprising:
      (1) a first contact tip portion; and
      (2) a compliant portion having a first end and a second end,
   wherein the first end is functionally connected to the first tip portion; and
   (B) a rigid sheath from which the first contact tip portion of the pin element extends and wherein the rigid sheath has an interior opening that retains the pin element without significantly restricting the compliance of the compliant portion along a longitudinal axis of the pin element as the first contact tip portion moves longitudinally relative to the sheath,
   wherein the compliant portion comprises at least one multi-turn element that comprises a plurality of turns which provide the multi-turn element with compliance, and wherein the pin element comprises a feature selected from the group consisting of: (1) the multi-turn element comprising two serially located sets of multi-turn elements separated by a non-compliant element; (2) a feature extending from an intermediate portion along a length of the pin element that extends into an opening located in an intermediate portion along a length of the sheath to inhibit the pin element from inadvertently being removed from the sheath; (3) a feature extending from the intermediate portion along the length of the pin element that is connected to an intermediate portion along a length of the sheath to inhibit the pin element from inadvertently being removed from the sheath; (4) a first locking feature on the pin element that engages a second locking feature on the sheath, wherein at least one of the first and second locking features are compliant and allows, or allowed, initial loading of the pin into the interior portion of the sheath, allows compliant movement within a working range, and allows retention of the first contact tip portion within the compliant working range relative to an end of the sheath.

21. A pin probe for making electrical contact to an electronic circuit element, comprising:
   (A) a pin element, comprising:
      (1) a first contact tip portion;
      (2) a second contact tip portion; and
      (3) a compliant portion having a first end and a second end,
   wherein the first end is functionally connected to the first tip portion and the second end is functionally connected to the second contact tip portion;
   (B) a rigid sheath from which the first and second contact tip portions of the pin element extend and wherein the rigid sheath has an interior opening that retains the pin element without significantly restricting the compliance of the compliant portion along a longitudinal axis of the pin element as one of the first and second contact tip portions move longitudinally relative to the sheath,
   wherein the compliant portion comprises at least one multi-turn element that comprises a plurality of turns which provide the multi-turn element with compliance, and wherein the pin element comprises a feature selected from the group consisting of: (1) the multi-turn element comprising two serially located sets of multi-turn elements separated by a non-compliant element; (2) a feature extending from an intermediate portion along a length of the pin element that extends into an opening located in an intermediate portion along a length of the sheath to inhibit the pin element from inadvertently being removed from the sheath; (3) a feature extending from the intermediate portion along the length of the pin element that is connected to an intermediate portion along a length of the sheath to inhibit the pin element from inadvertently being removed from the sheath; (4) at least one locking feature that allows, or allowed, initial loading of the first contact tip portion from a distal position relative to a first respective end of the sheath to a working position more proximal to the first respective end of the sheath and at least one additional locking feature that allows, or allowed, initial loading of the second contact tip portion from a distal position relative to a second respective end of the sheath to a working position that is more proximate to the second respective end of the sheath.

22. An improved method of forming a multi-layer three-dimensional pin probe including a pin element comprising at least one multi-turn compliant element and at least one tip element, comprising: (A) forming a plurality of successive multi-material layers with each successive multi-material layer adhered to a previously formed multi-material layer and with each successive multi-material layer comprising at least two materials, at least one of which is at least one structural material and at least one other of which is at least one sacrificial material, and wherein each successive multi-material layer defines a successive cross-section of the pin probe, and wherein the forming of each of the plurality of successive multi-material layers comprises: (i) depositing at least a first of the at least two materials; (ii) depositing a second of the at least two materials; (iii) planarizing at least two of the at least two deposited materials, including planarizing at least one structural material and at least one sacrificial material; and (B) after the forming of the plurality of successive multi-material layers, removing at least a portion of the at least one sacrificial material from the at least one structural material to reveal the at least partially completed pin probe formed from the at least one structural material, wherein the improvement comprises:
   wherein the pin element has a longitudinal axis corresponding to a primary compliance direction of the pin probe and perpendicular to a normal to planes of the plurality of adhered layers, and wherein a sheath of the pin probe and the pin element are formed together from the plurality of multi-material layers with at least a portion of the pin element located within an interior of the sheath prior to removal of the sacrificial material and with the pin element being longitudinally compressible and at least partially compliantly moveable within the interior of the sheath after removal of at least a portion of the at least one sacrificial material.

23. The method of claim 22 wherein the pin element comprises a plurality of adhered layers.

\* \* \* \* \*